(12) United States Patent
Subbareddy et al.

(10) Patent No.: US 12,353,238 B2
(45) Date of Patent: Jul. 8, 2025

(54) FLEXIBLE INSTRUCTION SET ARCHITECTURE SUPPORTING VARYING FREQUENCIES

(71) Applicant: Intel Corporation, Santa Clara, CA (US)

(72) Inventors: Dheeraj Subbareddy, Portland, OR (US); Anshuman Thakur, Beaverton, OR (US); Atul Maheshwari, Portland, OR (US); Mahesh Kumashikar, Bangalore (IN); Md Altaf Hossain, Portland, OR (US); Ankireddy Nalamalpu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 776 days.

(21) Appl. No.: 17/484,399

(22) Filed: Sep. 24, 2021

(65) Prior Publication Data

US 2022/0011811 A1    Jan. 13, 2022

(51) Int. Cl.
*G06F 1/12* (2006.01)
*G06F 9/30* (2018.01)

(52) U.S. Cl.
CPC ............ *G06F 1/12* (2013.01); *G06F 9/30007* (2013.01); *G06F 9/30036* (2013.01); *G06F 9/30038* (2023.08)

(58) Field of Classification Search
CPC .... G06F 1/12; G06F 9/30038; G06F 9/30007; G06F 9/30036
USPC ......................................................... 713/400
See application file for complete search history.

(56) References Cited

U.S. PATENT DOCUMENTS

| | | | | |
|---|---|---|---|---|
| 5,459,855 A * | 10/1995 | Lelm | ........................ | G06F 1/12 713/400 |
| 6,043,677 A * | 3/2000 | Albu | .................. | H03K 19/1774 326/38 |
| 6,721,372 B1 * | 4/2004 | Banik | ..................... | H04M 1/73 375/364 |
| 6,745,369 B1 * | 6/2004 | May | ...................... | G06F 13/405 716/138 |
| 6,760,277 B1 * | 7/2004 | Farooq | ..................... | G06F 1/12 327/145 |
| 6,829,663 B1 * | 12/2004 | Ghaffari | ................ | G06F 13/385 710/65 |
| 7,245,240 B1 * | 7/2007 | Nguyen | ................. | H03K 5/135 326/46 |
| 7,673,267 B1 * | 3/2010 | Duong | ................ | G06F 30/3312 716/124 |
| 7,707,448 B1 * | 4/2010 | Kim | .......................... | G06F 1/12 713/400 |
| 7,804,852 B1 * | 9/2010 | Durham | ................ | H04J 3/0661 714/39 |
| 7,958,285 B1 * | 6/2011 | Chiu | ........................ | G06F 5/10 710/52 |

(Continued)

*Primary Examiner* — Paul R. Myers
(74) *Attorney, Agent, or Firm* — Fletcher Yoder, P.C.

(57) ABSTRACT

A semiconductor device may include a programmable fabric and a processor. The processor may utilize one or more extension architectures. At least one of these extension architectures may be used to integrate and/or embed the programmable fabric into the processor as part of the processor. Systems and methods for transitioning data between the programmable fabric and the processor associated with different clock domains is described.

22 Claims, 16 Drawing Sheets

(56) References Cited

U.S. PATENT DOCUMENTS

| | | | |
|---|---|---|---|
| 8,981,813 B2* | 3/2015 | Chan | H03K 19/17736 326/39 |
| 9,306,574 B1* | 4/2016 | Zhao | H03K 21/026 |
| 10,014,041 B1* | 7/2018 | Khare | H03K 19/00392 |
| 10,168,989 B1* | 1/2019 | Shou | G06F 5/065 |
| 10,833,679 B2 | 11/2020 | Clark et al. | |
| 2003/0169644 A1* | 9/2003 | Liao | H04L 25/05 365/221 |
| 2004/0064165 A1* | 4/2004 | Thompson | A61N 1/37264 607/59 |
| 2005/0200390 A1* | 9/2005 | Starr | H03L 7/18 327/156 |
| 2006/0215629 A1* | 9/2006 | Miller | H04N 21/4402 370/350 |
| 2007/0019766 A1* | 1/2007 | Bereza | H03L 7/07 375/354 |
| 2010/0030509 A1* | 2/2010 | Crain, II | G06F 5/01 702/123 |
| 2012/0084483 A1* | 4/2012 | Sanjive | G06F 13/385 710/305 |
| 2012/0110269 A1* | 5/2012 | Frank | G06F 9/383 711/137 |
| 2015/0188548 A1* | 7/2015 | Huang | G06F 3/167 327/156 |
| 2016/0049941 A1 | 2/2016 | How et al. | |
| 2017/0288684 A1* | 10/2017 | Ogihara | H03L 7/095 |
| 2018/0131636 A1* | 5/2018 | Konda | H04L 49/101 |
| 2019/0028112 A1* | 1/2019 | Kadri | H03M 1/123 |
| 2020/0067402 A1* | 2/2020 | Malchow | H02M 7/53875 |
| 2022/0269306 A1* | 8/2022 | Ahn | H03K 3/037 |

* cited by examiner

FLEXIBLE INSTRUCTION SET ARCHITECTURE SUPPORTING VARYING FREQUENCIES

BACKGROUND

This disclosure relates to a flexible instruction set architecture for a processor by incorporating a programmable fabric into the architecture of the processor to provide a more flexible instruction set architecture.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be noted that these statements are to be read in this light, and not as admissions of any kind.

Integrated circuits are found in numerous electronic devices, from handheld devices, computers, gaming systems, robotic devices, automobiles, and more. Some integrated circuits, such as central processing units (CPUs) and/or microprocessors (μP) may utilize offload computing and/or acc+ to utilize other devices (e.g., programmable logic devices) to assist the CPU/μP in performing certain operations. However, certain compute models for implementing offloading may be limited due to latency, memory coherency, or flexibility issues in the implementations used to provide the acceleration. For instance, the implementations may include an Ethernet-based accelerator, a peripheral component interconnect express (PCIE)-based accelerator, an Ultra Path Interconnect (UPI)-based accelerator, an Intel Accelerator Link (IAL), or a cache coherent interconnect for accelerators (CCIX)-based accelerator. However, at least some of these interconnects may have a high latency relative to latency in the CPU/μP, inflexibility of usage, and/or a lack of memory coherency. For instance, a PCIE/Ethernet-based implementations may have a relatively long latency (e.g., 100 μs) relative to the latency in the CPU/μP. Furthermore, the PCIE/Ethernet-based implementations may lack memory coherency. UPI/IAL/CCIX-based accelerator may have a lower latency (e.g., 1 μs) than the PCIE/Ethernet implementations while having coherency, but the UPI/IAL/CCIX-based accelerators may utilize limited flexibility via fine-grained memory sharing. For instance, UPI/IAL/CCIX-based accelerators are first integrated into core software before being utilized.

BRIEF DESCRIPTION OF THE DRAWINGS

Various aspects of this disclosure may be better understood upon reading the following detailed description and upon reference to the drawings in which.

DETAILED DESCRIPTION

Figure 1:
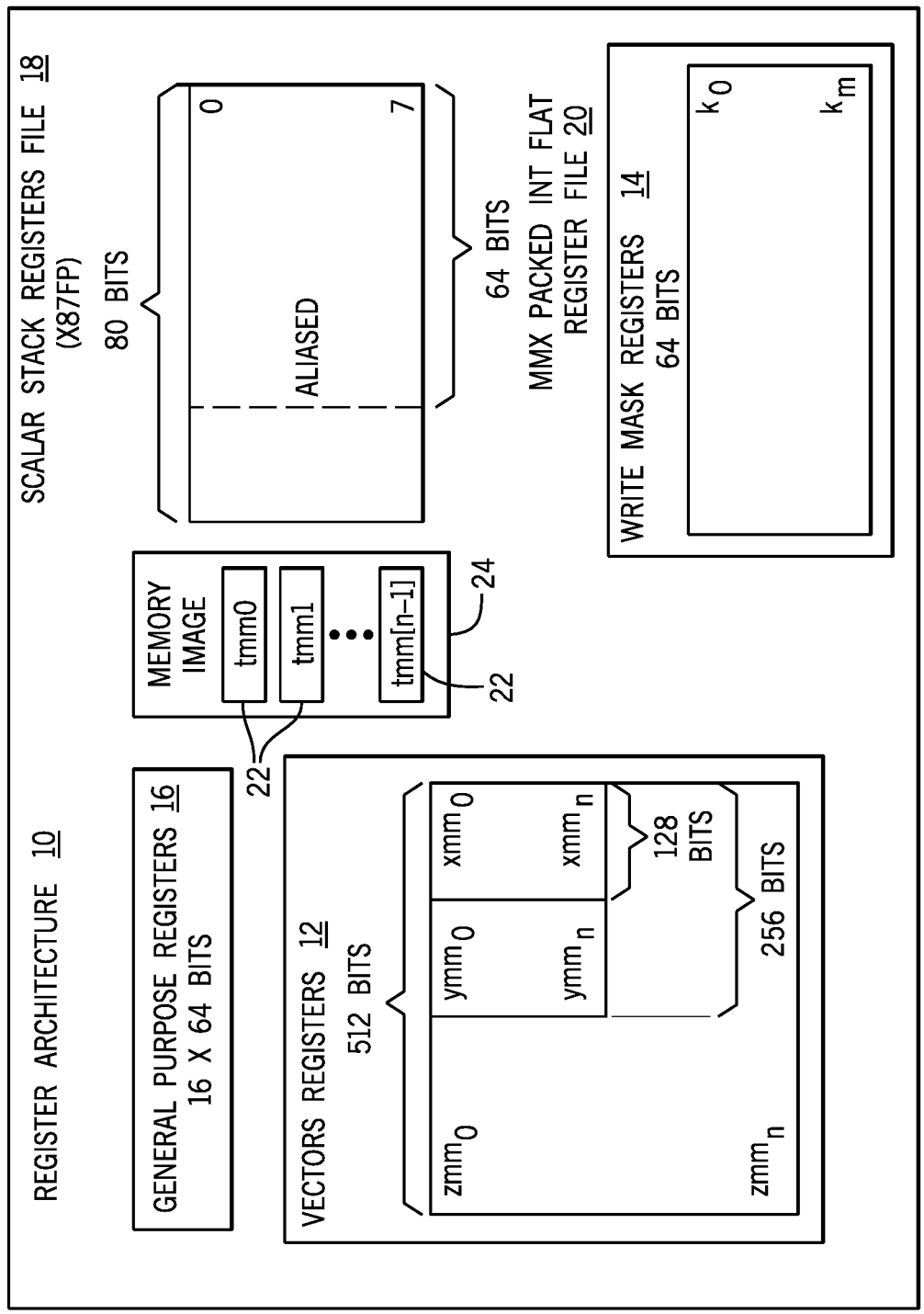
FIG. 1 is a block diagram of a register architecture, in accordance with an embodiment.
Figure 2:
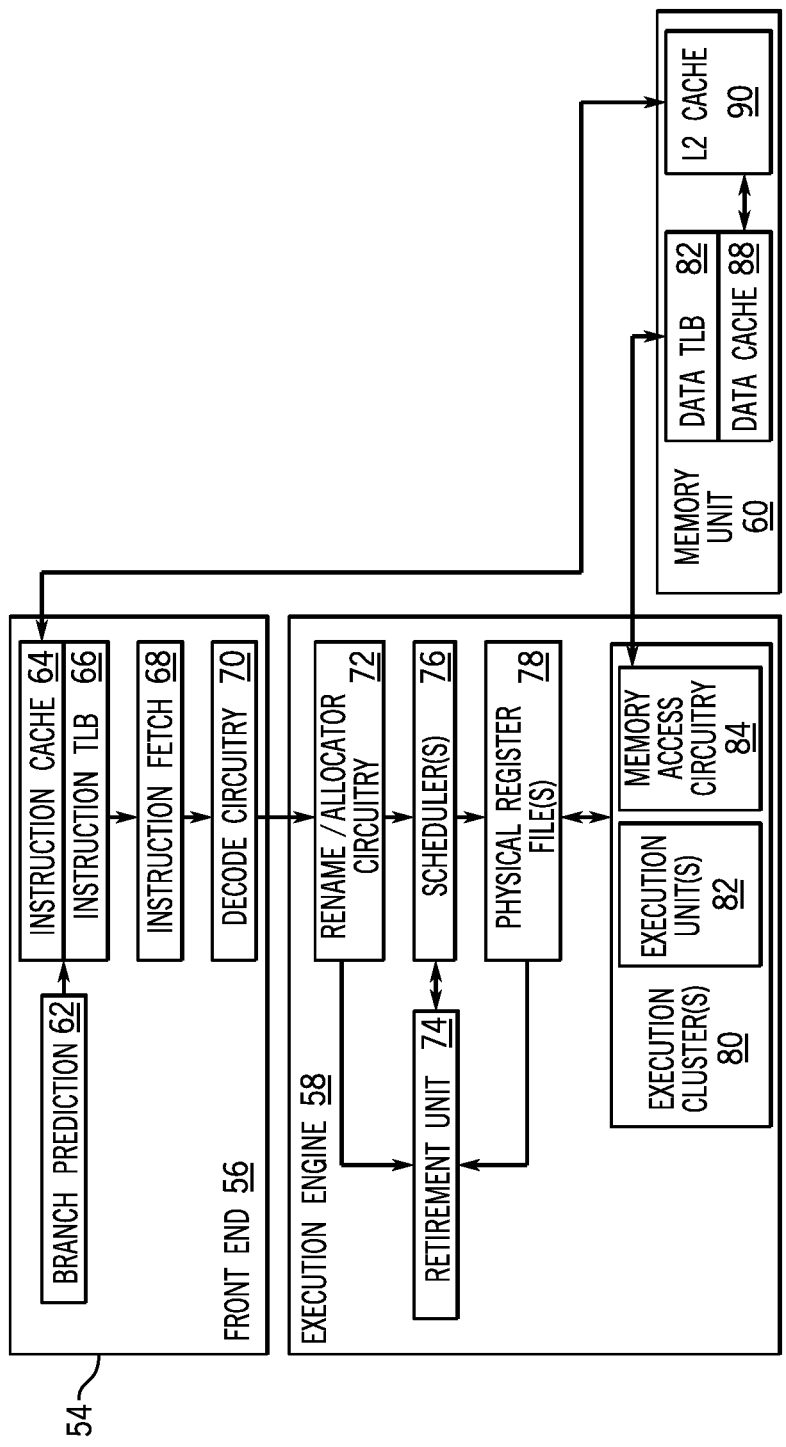
FIG. 2A is a block diagram illustrating an in-order pipeline and a register renaming, out-of-order issue/execution pipeline, in accordance with an embodiment.
FIG. 2B is a block diagram illustrating an in-order architecture core and a register renaming, out-of-order issue/execution architecture core to be included in a processor, in accordance with an embodiment.
Figure 3:
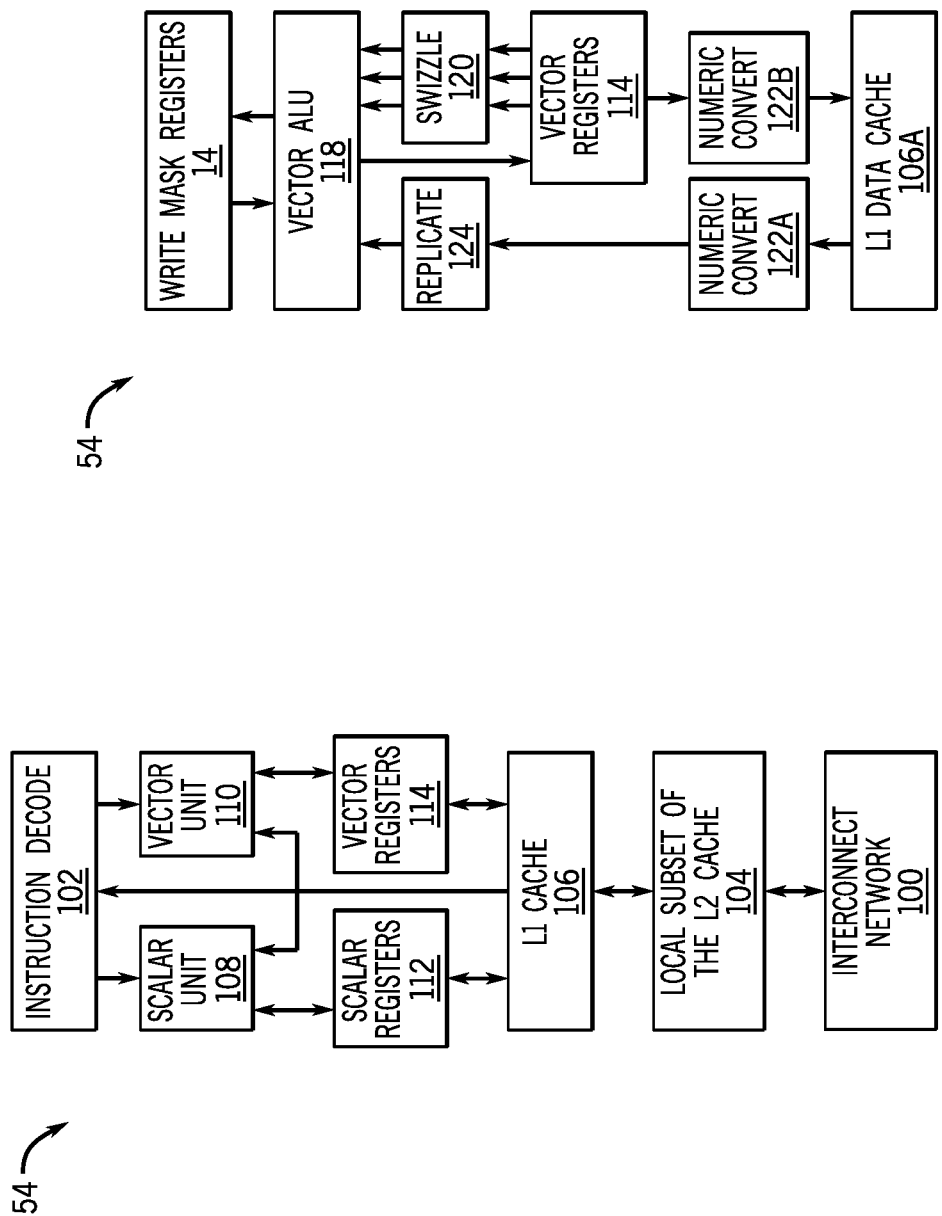
FIGS. 3A and 3B illustrate a block diagram of a more specific example in-order core architecture, which core would be one of several logic blocks (including other cores of the same type and/or different types) in a chip, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "including" and "having" are intended to be inclusive and mean that there may be additional elements other than the listed elements. Additionally, it should be understood that references to "some embodiments," "embodiments," "one embodiment," or "an embodiment" of the present disclosure are not intended to be interpreted as excluding the existence of additional embodiments that also incorporate the recited features. Furthermore, the phrase A "based on" B is intended to mean that A is at least partially based on B. Moreover, the term "or" is intended to be inclusive (e.g., logical OR) and not exclusive (e.g., logical XOR). In other words, the phrase A "or" B is intended to mean A, B, or both A and B. Moreover, this disclosure describes various data structures, such as instructions for an instruction set architecture. These are described as having certain domains (e.g., fields) and corresponding numbers of bits. However, it should be understood that these domains and sizes in bits are meant as examples and are not intended to be exclusive. Indeed, the data structures (e.g., instructions) of this disclosure may take any suitable form.

As previously discussed, various implementations for offload computing may have limitations due to latency, memory coherency, and/or flexibility issues. Instead, the flexible instruction set architecture (ISA) may be used to embed a programmable fabric (e.g., field-programmable gate array (FPGA)) in a processor. The embedded programmable fabric may be well suited to various compute types more efficiently than the compute types may be performed in the processor. For example, the embedded programmable fabric may be well suited for computes where a width/data path of the compute is narrower than a first threshold or wider than a second threshold, such as error detection and correction codes, scrambling and energy distribution codes, and the like. Additionally, the embedded programmable fabric may be well suited for computations that include a significant portion of swizzling and combinational logic, such as random number generation, message digest algorithms, and the like. Computations with non-traditional and/or arbitrary precision arithmetic (e.g., Galois/Montgomery arithmetic) are thus good candidates for computing using the programmable fabric. Many other computation types may also be good candidates for computing using the programmable fabric. For instance, polynomial/modulo arithmetic, approximate/probabilistic computation, modular exponentiation, stream graph traversals, motion estimation in video codecs, compression/decompression, Fast Fourier Transforms, and/or other computations may be good candidates for computing using the programmable fabric rather than the processor.

The flexible ISA may leverage an Advanced Matrix Extension (AMX) architecture of the processor to provide enhancements to functions of the processor by providing the flexibility of using a programmable fabric (e.g., FPGA) to offload some computes/compute types. For example, the flexible ISA may be used to make arithmetic logic units (ALUs) of the FPGA available for performing computations assisting the processor. The flexible ISA also may enable custom instructions for accelerating specific workloads to be configured by users. The custom instructions may be implemented using the embedded programmable fabric to provide flexibility while adding workload acceleration for potential future workloads (e.g., SHA-512 running 8λ). The flexible ISA may also shorten time-to-market for future x86 architecture innovations since post-production changes may be made programmatically using the embedded programmable fabric. The flexible ISA also provides a software ecosystem enabling instructions prior to new ISA extensions via flip-flop logic. The flexible ISA also provides an alternative to compute offload models by having cache coherency and lower latency that other offload models (e.g., Ethernet/PCIE) may not provide. As discussed in more detail below, the flexible ISA may also include clock transition circuitry to provide coherent communication between different clock domains using unit instructions. For example, within the flexible ISA, a clock frequency of a processor may be higher than a clock frequency of an FPGA.

These features may be used in any suitable integrated circuit devices, including microprocessors, application-specific integrated circuits (ASICs), or field programmable gate arrays (FPGAs). The following architecture discussed below with respect to FIGS. 1-9 is intended to represent one example that may be used.

Register Architecture

FIG. 1 is a block diagram of a register architecture 10, in accordance with an embodiment. In the embodiment illustrated, there are a number (e.g., 32) of vector registers 12 that may be a number (e.g., 512) of bits wide. In the register architecture 10; these registers are referenced as zmm0 through $zmm_i$. The lower order (e.g., 256) bits of the lower n (e.g., 16) zmm registers are overlaid on corresponding registers ymm. The lower order bits (e.g., 128 bits) of the lower n zmm registers that are also the lower order n bits of the ymm registers are overlaid on corresponding registers xmm.

Write mask registers 14 may include m (e.g., 8) write mask registers (k0 through km), each having a number (e.g., 64) of bits. Additionally or alternatively, at least some of the write mask registers 14 may have a different size (e.g., 16 bits). At least some of the vector mask registers 12 (e.g., k0) are prohibited from being used as a write mask. When such vector mask registers are indicated, a hardwired write mask (e.g., 0xFFFF) is selected and, effectively disabling write masking for that instruction.

General-purpose registers 16 may include a number (e.g., 16) of registers having corresponding bit sizes (e.g., 64) that are used along with x86 addressing modes to address memory operands. These registers may be referenced by the names RAX, RBX, RCX, RDX, RBP, RSI, RDI, RSP, and R8 through R15. Parts (e.g., 32 bits of the registers) of at least some of these registers may be used for modes (e.g., 32-bit mode) that are shorter than the complete length of the registers.

Scalar floating-point stack register file (x87 stack) 18 has an MMX packed integer flat register file 20 aliasing. The x87 stack 18 is an eight-element (or other number of elements) stack used to perform scalar floating-point operations on floating point data using the x87 instruction set extension. The floating-point data may have various levels of precision (e.g., 16, 32, 64, 80, or more bits). The MMX packed integer flat register files 20 are used to perform operations on 64-bit packed integer data, as well as to hold operands for some operations performed between the MMX packed integer flat register files 20 and the XMM registers.

Alternative embodiments may use wider or narrower registers. Additionally, alternative embodiments may use more, less, or different register files and registers. For example, some extensions used by the processor may have other associated registers. For instance, an Advanced Matrix Extension (AMX) may utilize a 64-bit programming paradigm that utilizes two-dimensional registers/tiles 22 representing sub-arrays from a larger two-dimensional memory image 24. The two-dimensional memory image 24 may be accessible similar to how the other registers are accessed. Additionally or alternatively, the two-dimensional memory image 24 may be separate from memory used to store the other registers and instead may be accessible via a data cache unit.

The AMX may also utilize an accelerator that operates on the tiles 22. For instance, the accelerator may include a tile matrix multiply unit (TMUL) that is operable to perform multiplies and adds on the tiles 22. In some embodiments, the tiles 22 may be allocated into one of several palettes. For example, an initialization palette may represent an initialized state while a divided palette may divide the two-dimensional memory image 24 into a number (e.g., 8) of tiles. In some embodiments, each allocation for the tiles 22 may have a maximum size (e.g., 1 or 2 kB) relative to an overall size (e.g., 8 or 16 kB) of the two-dimensional memory image 24. Additionally or alternatively, the sizes of the tiles 22 may be programmable to be set by a user/programmer. Additionally or alternatively, the palettes may also be configurable with new palette entries capable of allocating resources of the two-dimensional memory image 24 as needed.

Core Architectures, Processors, and Computer Architectures

Processor cores may be implemented in different ways, for different purposes, and in different processors. For instance, implementations of such cores may include: 1) a general purpose in-order core suitable for general-purpose computing; 2) a high performance general purpose out-of-order core suitable for general-purpose computing; 3) a special purpose core suitable for primarily for graphics, two-dimensional matrix multiplication/addition, and/or scientific (throughput) computing. Implementations of different processors may include: 1) a CPU including one or more general purpose in-order cores suitable for general-purpose computing and/or one or more general purpose out-of-order cores suitable for general-purpose computing; and 2) a coprocessor including one or more special purpose cores primarily for matrix arithmetic, graphics, and/or scientific (throughput).

Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as matrix arithmetic, integrated graphics, and/or scientific (throughput) logic, or as special purpose cores); and 4) a system on a chip that may include on the same die the described CPU (sometimes referred to as the application core(s) or application processor(s)), the above described coprocessor, and additional functionality. Example core architectures are described next, followed by descriptions of example processors and computer architectures.

In-Order and Out-of-Order Core Architecture

FIG. 2A is a block diagram illustrating an in-order pipeline and a register renaming, out-of-order issue/execution pipeline according to an embodiment of the disclosure. FIG. 2B is a block diagram illustrating both an embodiment of an in-order architecture core and an example register renaming, out-of-order issue/execution architecture core to be included in a processor according to embodiments. The solid lined boxes in FIGS. 2A and 2B illustrate the in-order pipeline and in-order core, while the addition of the dashed lined boxes illustrates the register renaming, out-of-order issue/execution pipeline and core. Given that the in-order aspect is a subset of the out-of-order aspect, the out-of-order aspect will be described.

In FIG. 2A, a pipeline 30 in the processor includes a fetch stage 32, a length decode stage 34, a decode stage 36, an allocation stage 38, a renaming stage 40, a scheduling (also known as a dispatch or issue) stage 42, a register read/memory read stage 44, an execute stage 46, a write back/memory write stage 48, an exception handling stage 50, and a commit stage 52.

FIG. 2B shows a processor core 54 including a front-end unit 56 coupled to an execution engine unit 58, and both are coupled to a memory unit 60. The processor core 54 may be a reduced instruction set computing (RISC) core, a complex instruction set computing (CISC) core, a very long instruction word (VLIW) core, or a hybrid or alternative core type. As yet another option, the processor core 54 may be a special-purpose core, such as, for example, a network or communication core, compression engine, coprocessor core, general purpose computing graphics processing unit (GPGPU) core, graphics core, or the like.

The front-end unit 56 includes a branch prediction unit 62 coupled to an instruction cache unit 64 that is coupled to an instruction translation lookaside buffer (TLB) 66. The TLB 66 is coupled to an instruction fetch unit 68. The instruction fetch unit 68 is coupled to a decode circuitry 70. The decode circuitry 70 (or decoder) may decode instructions and generate as an output one or more micro-operations, micro-code entry points, microinstructions, other instructions, or other control signals, which are decoded from, or which otherwise reflect, or are derived from, the original instructions. The decode circuitry 70 may be implemented using various different mechanisms. Examples of suitable mechanisms include, but are not limited to, look-up tables, hardware implementations, programmable logic arrays (PLAs), microcode read only memories (ROMs), etc. The processor core 54 may include a microcode ROM or other medium that stores microcode for macroinstructions (e.g., in decode circuitry 70 or otherwise within the front-end unit 56). The decode circuitry 70 is coupled to a rename/allocator unit 72 in the execution engine unit 58.

The execution engine unit 58 includes a rename/allocator unit 72 coupled to a retirement unit 74 and a set of one or more scheduler unit(s) 76. The scheduler unit(s) 76 represents any number of different schedulers, including reservations stations, central instruction window, etc. The scheduler unit(s) 76 is coupled to physical register file(s) unit(s) 78. Each of the physical register file(s) unit(s) 78 represents one or more physical register files storing one or more different data types, such as scalar integers, scalar floating points, packed integers, packed floating points, vector integers, vector floating points, statuses (e.g., an instruction pointer that is the address of the next instruction to be executed), etc.

In one embodiment, the physical register file(s) unit(s) 78 includes the vector registers 12, the write mask registers 14, and/or the x87 stack 18. These register units may provide architectural vector registers, vector mask registers, and general-purpose registers. The physical register file(s) unit(s) 78 is overlapped by the retirement unit 74 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.).

The physical register file(s) unit(s) 78 is coupled to an execution cluster(s) 80. The execution cluster(s) 80 includes a set of one or more execution units 82 and a set of one or more memory access circuitries 84. The execution units 82 may perform various operations (e.g., shifts, addition, subtraction, multiplication) and on various types of data (e.g., scalar floating point, packed integer, packed floating point, vector integer, vector floating point). While some embodiments may include a number of execution units 82 dedicated to specific functions or sets of functions, other embodiments may include only one execution unit 82 or multiple execution units 82 that all perform multiple different functions.

The scheduler unit(s) 76, physical register file(s) unit(s) 78, and execution cluster(s) 80 are shown as being singular or plural because some processor cores 54 create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster. In the case of a separate memory access pipeline, the processor core 54 may use separate memory access pipelines with the execution cluster 80 that has the memory access circuitry 84). It should also be understood that where separate pipelines are used, one or more of these pipelines may be out-of-order issue/execution and the rest perform in-order execution.

The set of memory access circuitry 84 is coupled to the memory unit 60. The memory unit 60 includes a data TLB unit 86 coupled to a data cache unit 88 coupled to a level 2 (L2) cache unit 90. The memory access circuitry 84 may include a load unit, a store address unit, and a store data unit, each of which is coupled to the data TLB unit 86 in the memory unit 60. The instruction cache unit 64 is further coupled to the level 2 (L2) cache unit 90 in the memory unit 60. The L2 cache unit 90 is coupled to one or more other levels of caches, accelerators, and/or to a main memory.

By way of example, the register renaming, out-of-order issue/execution core architecture may implement the pipeline 30 as follows: 1) the instruction fetch unit 68 performs the fetch and length decoding stages 32 and 34 of the pipeline 30; 2) the decode circuitry 70 performs the decode stage 36 of the pipeline 30; 3) the rename/allocator unit 72 performs the allocation stage 38 and renaming stage 40 of the pipeline; 4) the scheduler unit(s) 76 performs the schedule stage 42 of the pipeline 30; 5) the physical register file(s) unit(s) 78 and the memory unit 60 perform the register read/memory read stage 44 of the pipeline 30; the execution cluster 80 performs the execute stage 46 of the pipeline 30; 6) the memory unit 60 and the physical register file(s) unit(s) 78 perform the write back/memory write stage 48 of the pipeline 30; 7) various units may be involved in the exception handling stage 50 of the pipeline; and/or 8) the retirement unit 74 and the physical register file(s) unit(s) 78 perform the commit stage 52 of the pipeline 30.

The processor core 54 may support one or more instructions sets, such as an x86 instruction set (with or without additional extensions for newer versions); a MIPS instruction set of MIPS Technologies of Sunnyvale, CA; an ARM instruction set (with optional additional extensions such as NEON) of ARM Holdings of Sunnyvale, CA. Additionally or alternatively, the processor core 54 includes logic to support a packed data instruction set extension (e.g., AVX1, AVX2), thereby allowing the operations used by multimedia applications to be performed using packed data. Furthermore, as previously mentioned, the processor core 54 may include logic and/or circuitry to support an AMX instruction set of Intel Corporation of Santa Clara, CA. Furthermore, in some embodiments, the processor core 54 may use clock transition circuitry to communicate the logic and/or the circuitry supporting the AMX instruction set of Intel Corporation of Santa Clara, CA, as will be appreciated.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof, such as a time-sliced fetching and decoding and simultaneous multithreading in INTEL® Hyperthreading technology.

While register renaming is described in the context of out-of-order execution, register renaming may be used in an in-order architecture. While the illustrated embodiment of the processor also includes a separate instruction cache unit 64, a separate data cache unit 88, and a shared L2 cache unit 90, some processors may have a single internal cache for both instructions and data, such as, for example, a Level 1 (L1) internal cache, or multiple levels of the internal cache. In some embodiments, the processor may include a combination of an internal cache and an external cache that is external to the processor core 54 and/or the processor. Alternatively, some processors may use a cache that is external to the processor core 54 and/or the processor.

FIGS. 3A and 3B illustrate more detailed block diagrams of an in-order core architecture. The processor core 54 includes one or more logic blocks (including other cores of the same type and/or different types) in a chip. The logic blocks communicate through a high-bandwidth interconnect network (e.g., a ring network) with some fixed function logic, memory I/O interfaces, and other I/O logic, depending on the application.

FIG. 3A is a block diagram of a single processor core 54, along with its connection to an on-die interconnect network 100 and with its local subset of the Level 2 (L2) cache 104, according to embodiments of the disclosure. In one embodiment, an instruction decoder 102 supports the x86 instruction set with a packed data instruction set extension. An L1 cache 106 allows low-latency accesses to cache memory into the scalar and vector units. While in one embodiment (to simplify the design), a scalar unit 108 and a vector unit 110 use separate register sets (respectively, scalar registers 112 (e.g., x87 stack 18) and vector registers 114 (e.g., vector registers 12)) and data transferred between them is written to memory and then read back in from a level 1 (L1) cache 106, alternative embodiments of the disclosure may use a different approach (e.g., use a single register set or include a communication path that allow data to be transferred between the two register files without being written and read back).

The local subset of the L2 cache 104 is part of a global L2 cache unit 90 that is divided into separate local subsets, one per processor core. Each processor core 54 has a direct access path to its own local subset of the L2 cache 104. Data read by a processor core 54 is stored in its L2 cache 104 subset and can be accessed quickly, in parallel with other processor cores 54 accessing their own local L2 cache subsets. Data written by a processor core 54 is stored in its own L2 cache 104 subset and is flushed from other subsets, if necessary. The interconnection network 100 ensures coherency for shared data between cores and/or accelerators. The interconnection network 100 is bi-directional to allow agents such as processor cores, L2 caches, and other logic blocks to communicate with each other within the chip. Each data-path may have a number (e.g., 1012) of bits in width per direction.

FIG. 3B is an expanded view of part of the processor core in FIG. 3A according to embodiments of the disclosure. FIG. 3B includes an L1 data cache 106A part of the L1 cache 106, as well as more detail regarding the vector unit 110 and the vector registers 114. Specifically, the vector unit 110 may be a vector processing unit (VPU) (e.g., a vector arithmetic logic unit (ALU) 118) that executes one or more of integer, single-precision float, and double-precision float instructions. The VPU supports swizzling the register inputs with a swizzle unit 120, numeric conversion with numeric convert units 122A and 122B, and replication with a replication unit 124 on the memory input. The write mask registers 14 allow predicating resulting vector writes.

Figure 4:
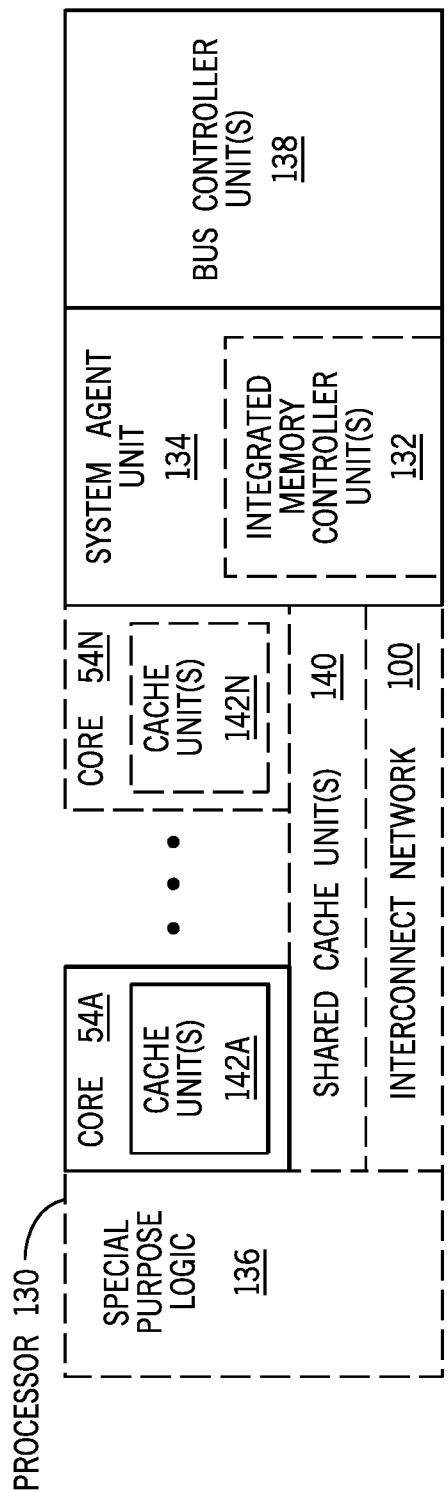
FIG. 4 is a block diagram of a processor that may have more than one core, may have an integrated memory controller, and may have integrated graphics, in accordance with an embodiment.

FIG. 4 is a block diagram of a processor 130 that may have more than one processor core 54, may have an integrated memory controller unit(s) 132, and may have integrated graphics according to embodiments of the disclosure. The solid lined boxes in FIG. 4 illustrate a processor 130 with a single core 54A, a system agent unit 134, a set of one or more bus controller unit(s) 138, while the optional addition of the dashed lined boxes illustrates the processor 130 with multiple cores 54A-N, a set of one or more integrated memory controller unit(s) 132 in the system agent unit 134, and a special purpose logic 136.

Thus, different implementations of the processor 130 may include: 1) a CPU with the special purpose logic 136 being matrix arithmetic, integrated graphics, and/or scientific (throughput) logic (which may include one or more cores), and the cores 54A-N being one or more general purpose cores (e.g., general purpose in-order cores, general purpose out-of-order cores, or a combination thereof); 2) a coprocessor with the cores 54A-N being a relatively large number of special purpose cores intended primarily for matrix arithmetic, graphics, and/or scientific (throughput); and 3) a coprocessor with the cores 54A-N being a relatively large number of general purpose in-order cores. Thus, the processor 130 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), an embedded processor, or the like. The processor 130 may be implemented on one or more chips. The processor 130 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 140, and external memory (not shown) coupled to the set of integrated memory controller unit(s) 132. The set of shared cache units 140 may include one or more mid-level caches, such as level 2 (L2), level 3 (L3), level 4 (L4), or other levels of cache, a last level cache (LLC), and/or combinations thereof. While a ring-based interconnect network 100 may interconnect the special purpose logic 136 (integrated graphics logic is an example of special purpose logic 136), the set of shared cache units 140, and/or the system agent unit 134/integrated memory controller unit(s) 132 may use any number of known techniques for interconnecting such units. For example, coherency may be maintained between one or more cache units 142A-N and cores 54A-N.

In some embodiments, one or more of the cores 54A-N are capable of multi-threading. The system agent unit 134 includes those components coordinating and operating the cores 54A-N. The system agent unit 134 may include, for example, a power control unit (PCU) and a display unit. The PCU may be or may include logic and components used to regulate the power state of the cores 54A-N and the special purpose logic 136. The display unit is used to drive one or more externally connected displays.

The cores 54A-N may be homogenous or heterogeneous in terms of architecture instruction set. That is, two or more of the cores 54A-N may be capable of execution of the same instruction set, while others may be capable of executing only a subset of a single instruction set or a different instruction set.

Computer Architecture

Figure 5:
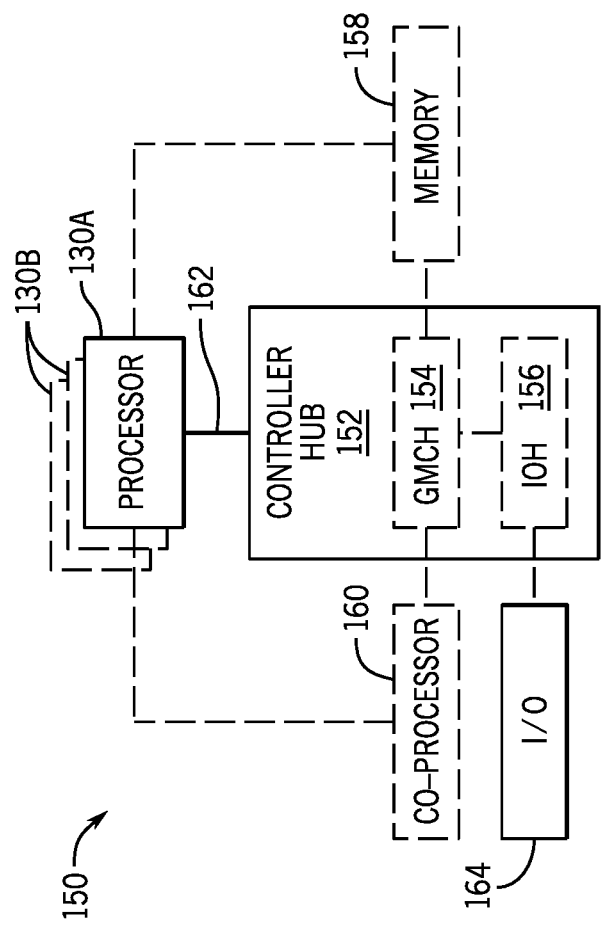
FIG. 5 is a block diagram of a system, in accordance with an embodiment.
Figure 6:
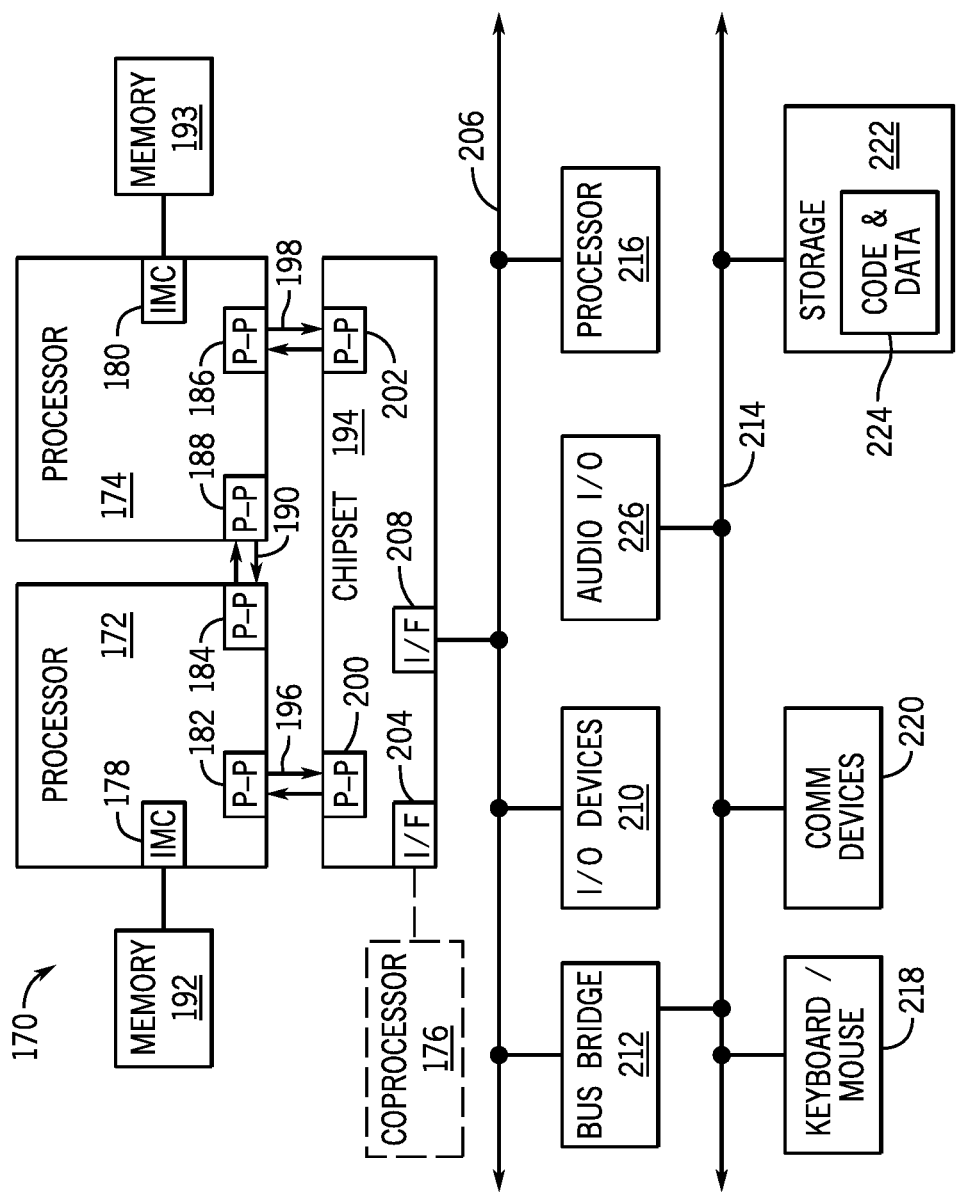
FIG. 6 is a block diagram of a first more specific example system, in accordance with an embodiment.
Figure 7:
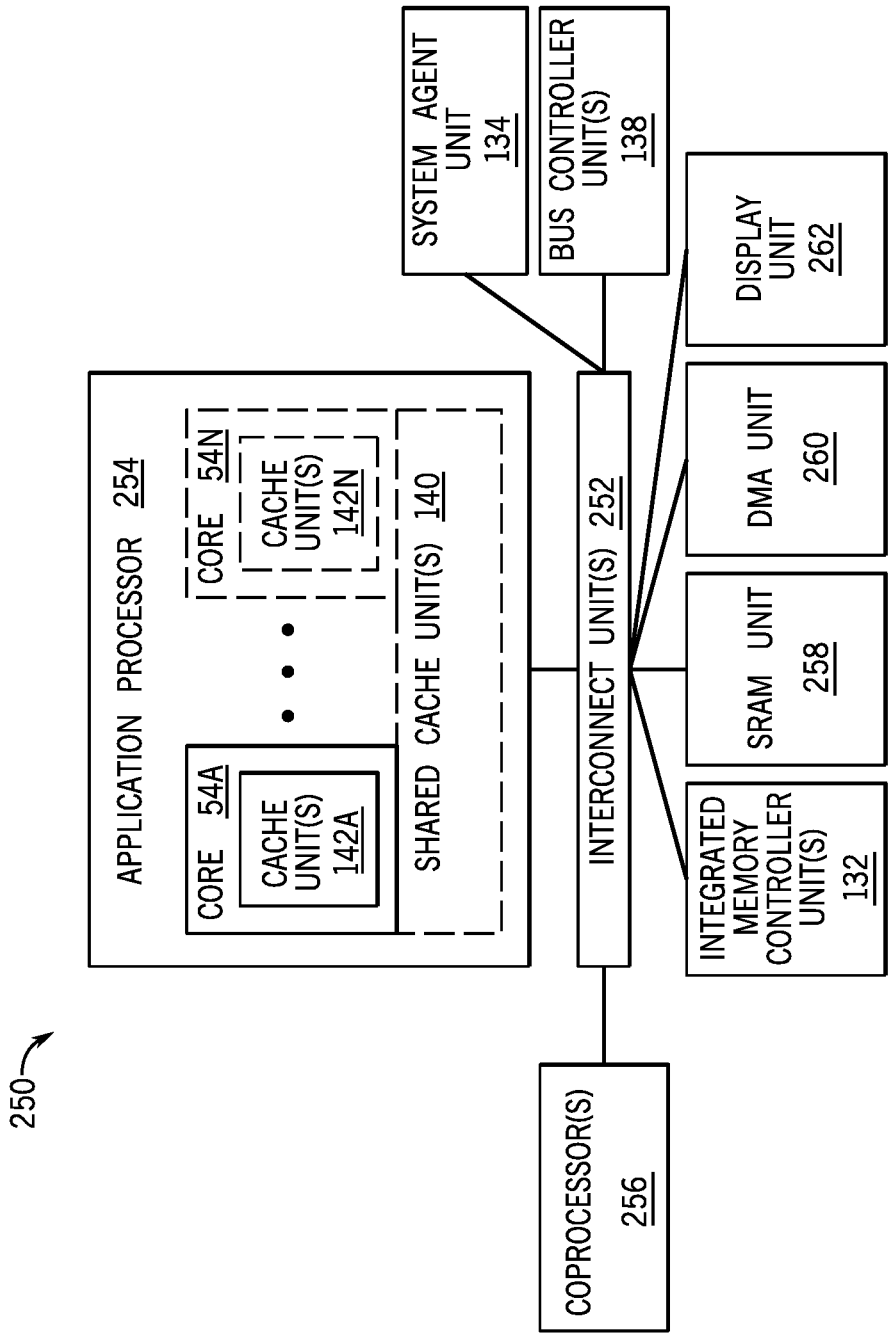
FIG. 7 is a block diagram of a system on a chip (SoC), in accordance with an embodiment.

FIGS. 5-7 are block diagrams of embodiments of computer architectures. These architectures may be suitable for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, handheld devices, and various other electronic devices. In general, these architectures may be suitable for a wide variety of systems or electronic devices capable of incorporating the processor 130 and/or other execution logic.

Referring now to FIG. 5, shown is a block diagram of a system 150 in accordance with an embodiment. The system 150 may include one or more processors 130A and 130B that are coupled to a controller hub 152. The controller hub 152 may include a graphics memory controller hub (GMCH) 154 and an Input/Output Hub (IOH) 156 (which may be on separate chips); the GMCH 154 includes memory and graphics controllers to which are coupled a memory 158 and a coprocessor 160; and the IOH 156 couples input/output (I/O) devices 164 to the GMCH 154. Alternatively, one or both of the memory and graphics controllers are integrated within the processor 130 (as described herein), the memory 158 and the coprocessor 160 are coupled to (e.g., directly to) the processor 130A, and the controller hub 152 in a single chip with the IOH 156.

The optional nature of an additional processor 130B is denoted in FIG. 5 with broken lines. Each of the processors 130A and 130B may include one or more of the processor cores 54 described herein and may be some version of the processor 130.

The memory 158 may be, for example, dynamic random-access memory (DRAM), phase change memory (PCM), or a combination thereof. For at least one embodiment, the controller hub 152 communicates with the processor(s) 130A, 130B via a multi-drop bus, such as a frontside bus (FSB), point-to-point interface such as QuickPath Interconnect (QPI), or similar connection 162.

In one embodiment, the coprocessor 160 is a special-purpose processor, such as, for example, a high-throughput MIC processor, a network or communication processor, a compression engine, a graphics processor, a GPGPU, an embedded processor, or the like. In an embodiment, the controller hub 152 may include an integrated graphics accelerator and/or the AMX accelerator (e.g., TMUL).

There can be a variety of differences between the physical resources of the processors 130A, 130B in terms of a spectrum of metrics of merit including architectural, microarchitectural, thermal, power consumption characteristics, and the like.

In some embodiments, the processor 130A executes instructions that control data processing operations of a general type. Embedded within the instructions may be coprocessor instructions. The processor 130A recognizes these coprocessor instructions as being of a type that should be executed by the attached coprocessor 160. Accordingly, the processor 130A issues these coprocessor instructions (or control signals representing coprocessor instructions) on a coprocessor bus or other interconnect, to the coprocessor 160. The coprocessor 160 accepts and executes the received coprocessor instructions. Additionally or alternatively, the processor 130A may recognize coprocessor instructions for a programmable fabric and may issue these programmable fabric instructions to the TMUL that, in turn, directs the programmable fabric instructions to the programmable fabric.

Referring now to FIG. 6, shown is a more detailed block diagram of a multiprocessor system 170 in accordance with an embodiment. As shown in FIG. 6, the multiprocessor system 170 is a point-to-point interconnect system, and includes a processor 172 and a processor 174 coupled via a point-to-point interface 190. Each of the processors 172 and 174 may be some version of the processor 130. In one embodiment of the disclosure, processors 172 and 174 are respectively processors 130A and 130B, while coprocessor 176 is coprocessor 160. In another embodiment, processors 172 and 174 are respectively processor 130A and coprocessor 160.

Processors 172 and 174 are shown including integrated memory controller (IMC) units 178 and 180, respectively. The processor 172 also includes point-to-point (P-P) interfaces 182 and 184 as part of its bus controller units. Similarly, the processor 174 includes P-P interfaces 186 and 188. The processors 172 and 174 may exchange information via a point-to-point interface 190 using P-P interfaces 184, 188. As shown in FIG. 6, IMC units 178 and 180 couple the processors to respective memories, namely a memory 192 and a memory 193 that may be different portions of main memory locally attached to the respective processors 172, 174.

The processors 172 and 174 may each exchange information with a chipset 194 via individual P-P interfaces 196 and 198 using P-P interfaces 182, 200, 186, and 202. The chipset 194 may optionally exchange information with the coprocessor 176 via a high-performance interface 204. In an embodiment, the coprocessor 176 is a special-purpose processor, such as, for example, a high-throughput MIC processor, a network or communication processor, a compression engine, a graphics processor, a GPGPU, an embedded processor, or the like.

A shared cache (not shown) may be included in either processor 172 or 174 or outside of both processors 172 or 174 that is connected with the processors 172, 174 via respective P-P interfaces (e.g., interconnects) such that either or both processors' local cache information may be stored in the shared cache if a respective processor is placed into a low power mode.

The chipset 194 may be coupled to a first bus 206 via an interface 208. In an embodiment, the first bus 206 may be a Peripheral Component Interconnect (PCI) bus or a bus such as a PCI Express bus or another third generation I/O interconnect bus, although the scope of the present disclosure is not so limited.

As shown in FIG. 6, various I/O devices 210 may be coupled to first bus 206, along with a bus bridge 212 that couples the first bus 206 to a second bus 214. In an embodiment, one or more additional processor(s) 216, such as coprocessors, high-throughput MIC processors, GPGPUs, accelerators (such as, e.g., graphics accelerators or digital signal processing (DSP) units), field programmable gate arrays, or any other processors, are coupled to the first bus 206. In an embodiment, the second bus 214 may be a low pin count (LPC) bus. Various devices may be coupled to the second bus 214 including, for example, a keyboard and/or mouse 218, communication devices 220 and a storage unit 222 such as a disk drive or other mass storage device which may include instructions/code and data 224, in an embodiment. Further, an audio I/O 226 may be coupled to the second bus 214. Note that other architectures may be deployed for the multiprocessor system 170. For example, instead of the point-to-point architecture of FIG. 6, the multiprocessor system 170 may implement a multi-drop bus or other such architectures.

Referring now to FIG. 7, shown is a block diagram of a SoC 250 in accordance with an embodiment. Similar elements in FIG. 4 have like reference numerals. Also, dashed lined boxes are optional features included in some SoCs 250. In FIG. 7, an interconnect unit(s) 252 is coupled to: an application processor 254 that includes a set of one or more cores 54A-N that includes cache units 142A-N, and shared cache unit(s) 140; a system agent unit 134; a bus controller unit(s) 138; an integrated memory controller unit(s) 132; a set or one or more coprocessors 256 that may include integrated graphics logic, an image processor, an audio processor, and/or a video processor; a static random access memory (SRAM) unit 258; a direct memory access (DMA) unit 260; and a display unit 262 to couple to one or more external displays. In an embodiment, the coprocessor(s) 256 include a special-purpose processor, such as, for example, a network or communication processor, a compression engine, a GPGPU, a high-throughput MIC processor, an embedded processor, or the like.

Embodiments of the mechanisms disclosed herein may be implemented in hardware, software, firmware, or a combination of such implementation approaches. Embodiments of the disclosure may be implemented as computer programs and/or program code executing on programmable systems including at least one processor, a storage system (including volatile and non-volatile memory and/or storage elements), at least one input device, and at least one output device.

Program code, such as data 224 illustrated in FIG. 6, may be applied to input instructions to perform the functions described herein and generate output information. The output information may be applied to one or more output devices. For purposes of this application, a processing system includes any system that has a processor, such as, for example, a digital signal processor (DSP), a microcontroller, an application-specific integrated circuit (ASIC), or a microprocessor.

The program code may be implemented in a high-level procedural or object-oriented programming language to communicate with a processing system. The program code may also be implemented in an assembly language or in a machine language. In fact, the mechanisms described herein are not limited in scope to any particular programming language. In any case, the language may be a compiled language or an interpreted language.

One or more aspects of at least one embodiment may be implemented by representative instructions stored on a machine-readable medium that represents various logic within the processor that, when read by a machine causes the machine to fabricate logic to perform the techniques described herein. Such representations, known as "intellectual property cores" or "IP cores," may be stored on a tangible, machine readable medium and supplied to various customers or manufacturing facilities to load into the fabrication machines that make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic cards, optical cards, or any other type of media suitable for storing electronic instructions.

Accordingly, embodiments of the embodiment include non-transitory, tangible machine-readable media containing instructions or containing design data, such as designs in Hardware Description Language (HDL) that may define structures, circuits, apparatuses, processors and/or system features described herein. Such embodiments may also be referred to as program products.

Programmable Logic Device

Figure 8:
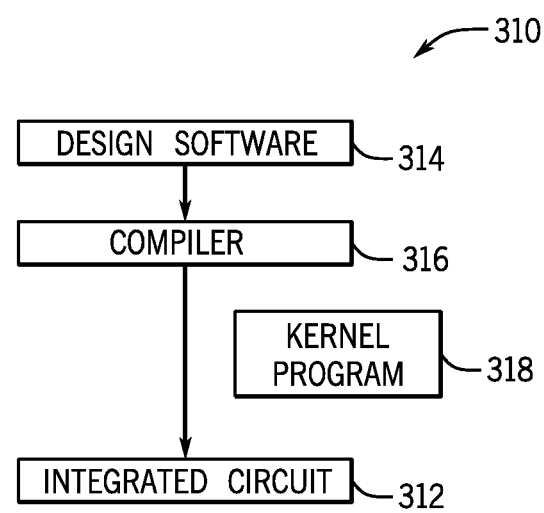
FIG. 8 is a block diagram of a process for programming an integrated circuit including a programmable fabric, in accordance with an embodiment.

As previously noted, the processor 130 may utilize one or more programmable fabrics (e.g., FPGAs) for acceleration via an AMX (and/or other) extension. With the foregoing in mind, FIG. 8 illustrates a block diagram of a system 310 used to configure a programmable device. A designer may implement functionality on an integrated circuit, such as an integrated circuit 312 that includes some reconfigurable circuitry, such as an FPGA. A designer may implement a circuit design to be programmed onto the integrated circuit 312 using design software 314, such as a version of Quartus by Altera™. The design software 314 may use a compiler 316 to generate a low-level circuit-design, which may be provided as a kernel program, sometimes known as a program object file or bitstream, that programs the integrated circuit 312. That is, the compiler 316 may provide machine-readable instructions representative of the circuit design to the integrated circuit 312. As discussed below, these machine-readable instructions, when verified, may be transmitted to the FPGA along using microcode updates for the processor 130.

Figure 9:
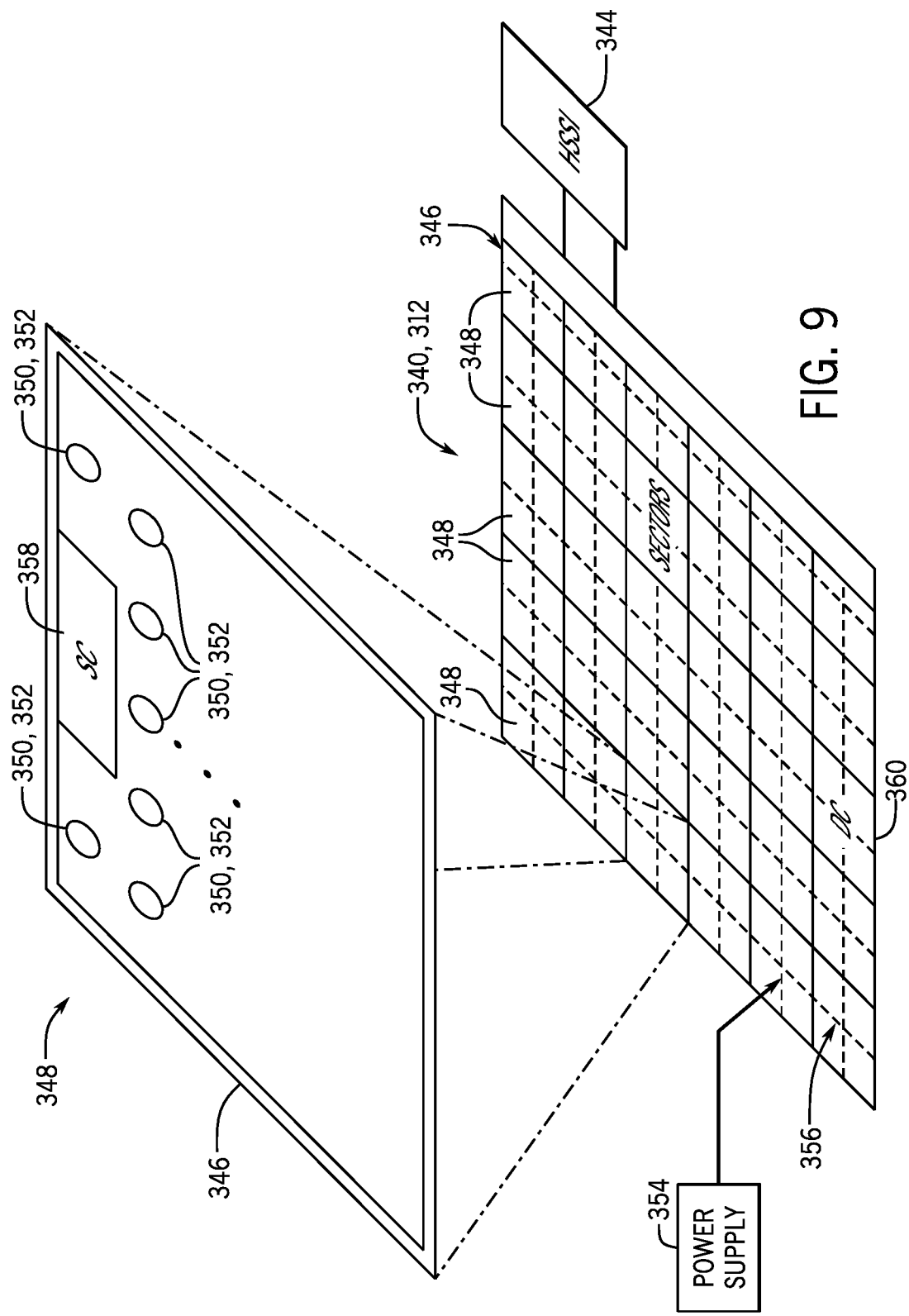
FIG. 9 is a diagram of the programmable fabric of FIG. 8, in accordance with an embodiment.

The integrated circuit 312 may include any programmable logic device, such as a field programmable gate array (FPGA) 340, as shown in FIG. 9. For the purposes of this example, the FPGA 340 is referred to as an FPGA, though it should be understood that the device may be any suitable type of programmable logic device (e.g., an application-specific integrated circuit and/or application-specific standard product). In one example, the FPGA 340 is a sectorized FPGA of the type described in U.S. Patent Publication No. 2016/0049941, "Programmable Circuit Having Multiple Sectors," which is incorporated by reference in its entirety for all purposes. The FPGA 340 may be formed on a single plane. Additionally or alternatively, the FPGA 340 may be a three-dimensional FPGA having a base die and a fabric die of the type described in U.S. Pat. No. 10,833,679, "Multipurpose Interface for Configuration Data and User Fabric Data," which is incorporated by reference in its entirety for all purposes.

In the example of FIG. 9, the FPGA 340 may include transceiver circuitry 344 for driving signals off of the FPGA 340 and for receiving signals from other devices. Interconnection resources 346 may be used to route signals, such as clock or data signals, through the FPGA 340. The FPGA 340 of FIG. 9 is sectorized, meaning that programmable logic resources may be distributed through a number of discrete programmable logic sectors 348. Each programmable logic sector 348 may include a number of programmable logic elements 350 having operations defined by a respective configuration memory 352 (e.g., configuration random access memory (CRAM)). The programmable logic elements 350 may include combinational or sequential logic circuitry. For example, the programmable logic elements 350 may include look-up tables, registers, multiplexers, routing wires, and so forth. A designer may program the programmable logic elements 350 to perform a variety of desired functions. A power supply 354 may provide a source of voltage and current to a power distribution network (PDN) 356 that distributes electrical power to the various components of the FPGA 340. Operating the circuitry of the FPGA 340 causes power to be drawn from the power distribution network 356.

There may be any suitable number of programmable logic sectors 348 on the FPGA 340. Indeed, while 29 programmable logic sectors 348 are shown here, it should be appreciated that more or fewer may appear in an actual implementation (e.g., in some cases, on the order of 50, 100, 500, 1000, 5000, 10,000, 50,000, or 100,000 sectors or more). Each programmable logic sector 348 may include a sector controller (SC) 358 that controls the operation of the programmable logic sector 348. Each sector controller 358 may be in communication with a device controller (DC) 360. Each sector controller 358 may accept commands and data from the device controller 360, and may read data from and write data into its configuration memory 352 based on control signals from the device controller 360. In addition to these operations, the sector controller 358 may be augmented with numerous additional capabilities. For example, such capabilities may include locally sequencing reads and writes to implement error detection and correction on the configuration memory 352 and sequencing test control signals to effect various test modes.

The sector controllers 358 and the device controller 360 may be implemented as state machines and/or processors. For example, each operation of the sector controllers 358 or the device controller 360 may be implemented as a separate routine in a memory containing a control program. This control program memory may be fixed in a read-only memory (ROM) or stored in a writable memory, such as random-access memory (RAM). The ROM may have a size larger than would be used to store only one copy of each routine. This may allow each routine to have multiple variants depending on "modes" the local controller may be placed into. When the control program memory is implemented as random access memory (RAM), the RAM may be written with new routines to implement new operations and functionality into the programmable logic sectors 348. This may provide usable extensibility in an efficient and easily understood way. This may be useful because new commands could bring about large amounts of local activity within the sector at the expense of only a small amount of communication between the device controller 360 and the sector controllers 358.

Each sector controller 358 thus may communicate with the device controller 360, which may coordinate the operations of the sector controllers 358 and convey commands initiated from outside the FPGA 340. To support this communication, the interconnection resources 346 may act as a network between the device controller 360 and each sector controller 358. The interconnection resources may support a wide variety of signals between the device controller 360 and each sector controller 358. In one example, these signals may be transmitted as communication packets.

The FPGA 340 may be electrically programmed. With electrical programming arrangements, the programmable logic elements 350 may include one or more logic elements (wires, gates, registers, etc.). For example, during programming, configuration data is loaded into the configuration memory 352 using pins and input/output circuitry. In one example, the configuration memory 352 may be implemented as configuration random-access-memory (CRAM) cells. As discussed below, in some embodiments, the configuration data may be loaded into the FPGA 340 using an update to microcode of the processor in which the FPGA 340 is embedded. The use of configuration memory 352 based on RAM technology is described herein is intended to be only one example. Moreover, configuration memory 352 may be distributed (e.g., as RAM cells) throughout the various programmable logic sectors 348 the FPGA 340. The configuration memory 352 may provide a corresponding static control output signal that controls the state of an associated programmable logic element 350 or programmable component of the interconnection resources 346. The output signals of the configuration memory 352 may be applied to the gates of metal-oxide-semiconductor (MOS) transistors that control the states of the programmable logic elements 350 or programmable components of the interconnection resources 346.

The sector controllers 358 and/or the device controller 360 may determine when each sector controller 358 performs a CRAM read operation on the configuration memory 352 of its programmable logic sector 348. Each time the sector controller 358 performs a CRAM read of the configuration memory 352, power is drawn from the power distribution network 356. If too much power is drawn from the power distribution network 356 at any one time, the voltage provided by the power distribution network 356 could drop to an unacceptably low level, or too much noise could arise on the power distribution network 356. To avoid this, the device controller 360 and/or the sector controllers 358 may structure CRAM reads of the programmable logic sectors 348 to avoid excessive instantaneous power consumption by temporally and/or spatially distributing the CRAM reads across different programmable logic sectors 348.

The sector controller 358 of the programmable logic sector 348 is shown to read and write to the CRAM memory 352 by providing an ADDRESS signal to an address register 370 and providing a memory write signal (WRITE), a memory read signal (RD DATA), and/or the data to be written (WR DATA) to a data register 372. These signals may be used to cause the data register 372 to write data to or read data from a line of configuration memory 352 that has been activated along an address line 374, as provided by the ADDRESS signal applied to the address register 370. Memory read/write circuitry 376 may be used to write data into the activated configuration memory 352 cells when the data register 372 is writing data, and may be used to sense and read data from the activated configuration memory 352 cells when the data register 372 is reading data.

FPGA-Based Microarchitecture Integration

Figure 10:
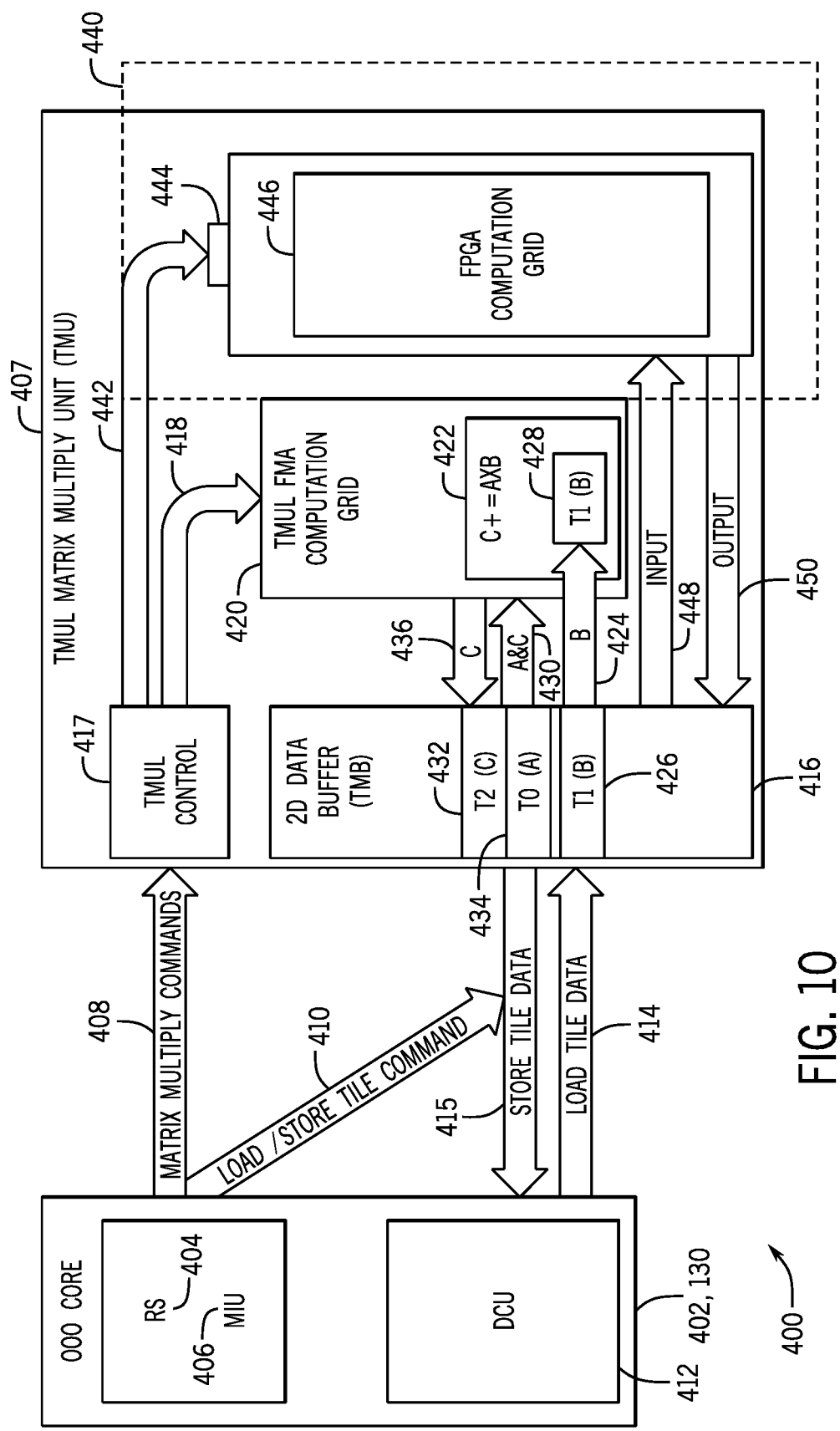
FIG. 10 is a diagram of a processor architecture including the programmable fabric of FIG. 9 in a monolithic arrangement, in accordance with an embodiment.

As previously discussed, the flexible instruction set architecture of the processor 130 may be used to integrate an embedded FPGA in the processor 130. The integration makes arithmetic logic units (ALUs) and/or other components of the FPGA 340 available for performing computations in assisting the processor 130. The flexible instruction set architecture may use an x86 memory consistency model and use a software ecosystem to provide flexible usage of instructions in the processor 130. FIG. 10 is a block diagram of an architecture 400 including an instruction set architecture for an advanced matrix extension (AMX) that may be used to integrate an FPGA into the processor 130. Although the illustrated embodiment pertains to an AMX, some embodiments may utilize other extensions that have suitable buffer sizes (e.g., >4 kB) and transfer/translation mechanisms (e.g., via data cache unit 88).

As illustrated, the architecture 400 includes an out-of-order (OOO) core 402. The OOO core 402 may include one or more execution clusters 80 of the pipeline 30 used to perform OOO operations. The OOO core 402 also includes one or more reservation stations 404 that permit the processor 130 to fetch and re-use data values once they are computed. The reservation stations 404 may be included in the scheduler unit(s) 76 of the execution engine unit 58 of FIG. 2B. The OOO core 402 also includes a memory instruction unit 406 (e.g., part of memory unit 60) that may be used to interface with memory (e.g., L2 cache unit 90).

Via the reservation stations 404 and/or the memory instruction unit 406, instructions may be transmitted to a tile matrix multiply unit (TMU) 407 that is used to perform computations on the tiles 22. For instance, matrix multiply commands 408 may be used to cause the TMU 407 to perform respective multiplication and/or accumulation operations using two or more tiles 22. A load/store tile command 410 may be used to load/store tile data into tiles 22 in the memory image 24. Data may be loaded or stored from the TMU 407 via a data cache unit (DCU) 412. For instance, the DCU 412 may include/be included in the data cache unit 88 and/or physical register file(s) unit(s) 78 of FIG. 2B. Via the DCU 412, the processor 130 may be used to load tile data 414 into and/or store tile data 415 from a register file (TMB) 416. The TMB 416 may include the memory image 24 of FIG. 1 and/or the physical register file(s) unit(s) 78 of FIG. 2B. The TMB 416 may be relatively large (e.g., 16 kB) and may have its usage, allocation, and locations defined programmatically by the incoming matrix multiply commands 408.

The incoming matrix multiply command 408 may be interpreted by TMUL control circuitry 417 that decodes incoming instructions indicating an operation and/or sizes/locations of one or more tiles 22 to be operated on in the TMU 407. The TMU 407 decodes a matrix multiple command 408 and sends a decoded command 418 to a TMUL fused-multiply-add (FMA) computation grid 420 when the command relates to operations performable in the TMUL FMA computation grid 420. The TMUL FMA computation grid 420 is a grid of fused multiply-add units able to read from and write to the tiles 22. The dimensions of the TMUL FMA computation grid 420 may be set to a maximum size of the tiles 22 with or without some additional space for cushion. The TMUL FMA computation grid 420 performs a computation 422. Specifically, the TMUL FMA computation grid 420 may operate on a B matrix 424 that is stored in a tile 426 in the TMB 416. As illustrated, the data in the tile 426 may be loaded into a local tile 428. A read operation 430 of matrices A and C may be used to read the matrices A and C to the TMUL FMA computation grid 420 from respective tiles 432 and 434 in the TMB 416. The TMUL FMA computation grid 420 performs the computation 422. For instance, the TMUL FMA computation grid 420 may multiply the A & B matrices together and add them to the matrix C to update the value in matrix C. The update 436 to the matrix C is stored back to the tile 432 in the TMB 416. The result (e.g., matrix C) is then loaded back to the OOO core 402 via the DCU 412.

The TMUL FMA computation grid 420 may be tuned to certain data types (e.g., INT 8) and may be unable to utilize other data types efficiently (e.g., FP16). However, an FPGA unit 440 may be included in the TMU 407 to add flexibility to the processor. The FPGA unit 440 may be used to extend flexibility by using the FPGA unit 440 to perform more flexible actions than are available in the TMUL FMA computation grid 420 alone. In some embodiments the FPGA unit 440 may be similar to the FPGA 340 of FIG. 9 described above. For instance, the FPGA unit 440 may be used to convert other data types to data types to which the TMUL FMA computation grid 420 is tuned thereby enabling the TMU 407 to efficiently utilize data types other than those to which the TMUL FMA computation grid 420 is tuned. To achieve such flexibility, the matrix multiply command 408 may be extended to include one or more bits in opcode to direct instructions to the FPGA unit 440 as a decoded command 442. Additionally or alternatively, at least some of the decoding of the matrix multiply command 408 may be performed in the FPGA unit 440. Additionally or alternatively, the FPGA unit 440 may utilize one or more memory controller and clock synchronization circuitries 444 to facilitate transfers of data from the TMUL control circuitry 417 and/or the TMB 416 into an FPGA computation grid 446 of the FPGA unit 440. For instance, the transfers between the TMUL control circuitry 417 and/or the TMB 416 may be asynchronous and utilizing a handshake to handle delays in handling flexible execution of instructions.

The FPGA computation grid 446 may include the programmable fabric of the FPGA unit 440 that may be configured to perform flexible functions using a configuration stored in the FPGA unit 440 via a compiled design that is created as user logic and loaded into the FPGA unit 440. In some embodiments, the configuration of the FPGA computation grid 446 may be loaded from configuration RAM (CRAM) of the FPGA unit 440 at startup of the processor. Additionally or alternatively, the configuration of the FPGA computation grid 446 may be loaded at any time designated by the processor.

The FPGA unit 440 may load data to be acted on and/or store data acted on in the TMB 416 based on the decoded command 442. In other words, data is extracted from the TMB 416 via a connection 448 and written back to the TMB 416 via a connection 450.

The FPGA unit 440 may support multiple instructions. These various instructions add flexibility to the processor/AMX. These flexible instructions may be programmed in by customers/users in the field. Each instruction may have its own phase-locked loop (PLL) in the one or more memory controller and clock synchronization circuitries 444. Additionally or alternatively, at least two different instructions may share a PLL. The instructions may be loaded at boot time (or another time designated by the processor) and reflected back to the operating system. As noted below, the instructions may be checked for authentication and/or verification of the instructions before being loaded. Moreover, the clock synchronization circuitries 444 may facilitate data communication between the processor 130 and the FPGA unit 440 using different clock frequencies, as will be appreciated.

Figure 11:
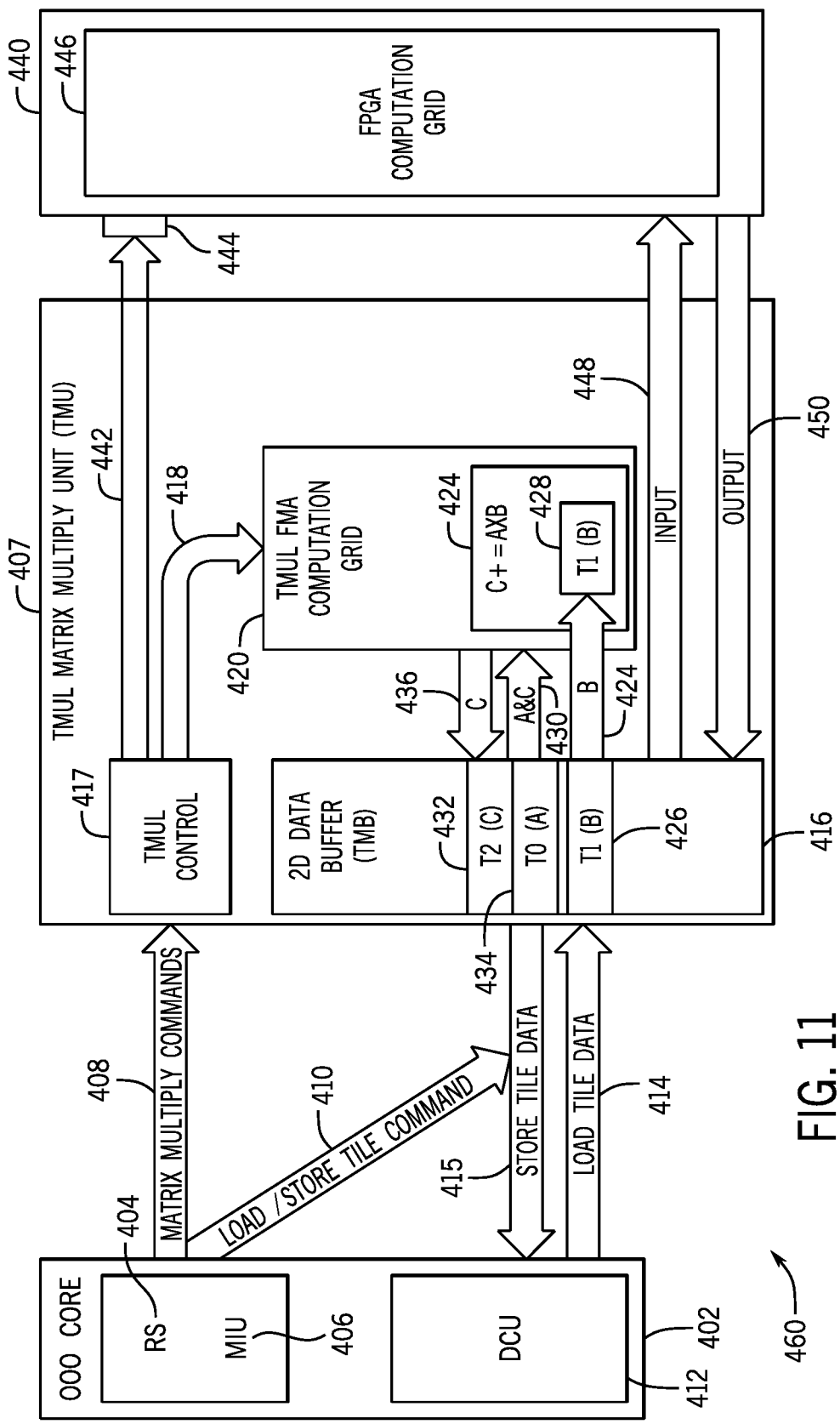
FIG. 11 is a diagram of a processor architecture including the programmable fabric of FIG. 9 with the processor and the programmable fabric located on separate silicon substrates, in accordance with an embodiment.

As illustrated, the FPGA unit 440 may be monolithically located on the same silicon as the TMU 407 with the FPGA unit 440 physically within the TMU 407. However, in some embodiments, the FPGA unit 440 may be placed on different silicon. For instance, as illustrated in FIG. 11, the FPGA unit 440 may be located on a separate die (e.g., in a three-dimensional configuration) from the rest of the TMU 407. This separation of the FPGA unit 440 onto a separate die from the rest of the TMU 407 may enable the processor to be implemented as a multi-process technology. Implementation as an MCP that may reduce the costs for integrating the FPGA unit 440 into the processor. Additionally or alternatively, implementation as an MCP may reduce time to market for deployment of the processor and/or updates to the processor.

As previously noted, deployment of the FPGA-based instruction set architecture may be made available by having a stored FPGA configuration loaded at bootup of the processor as part of a cold reset or a warm reset flow in some embodiments. The loading at bootup may be used to overcome the delay in loading a programming bitstream (e.g., configuration bitstream) into the FPGA unit 440 when commands are to be utilized by the processor. This preloading of the applicable configuration(s) may avoid the delays that would occur to wait to load the configuration(s) until after the demand occurs. As such, embodiments where loading of the configuration bitstream occurs during a reset, a single ISA manifestation via the configuration of the FPGA unit 440 may be present during a boot cycle until the processor is reset.

Figure 12:
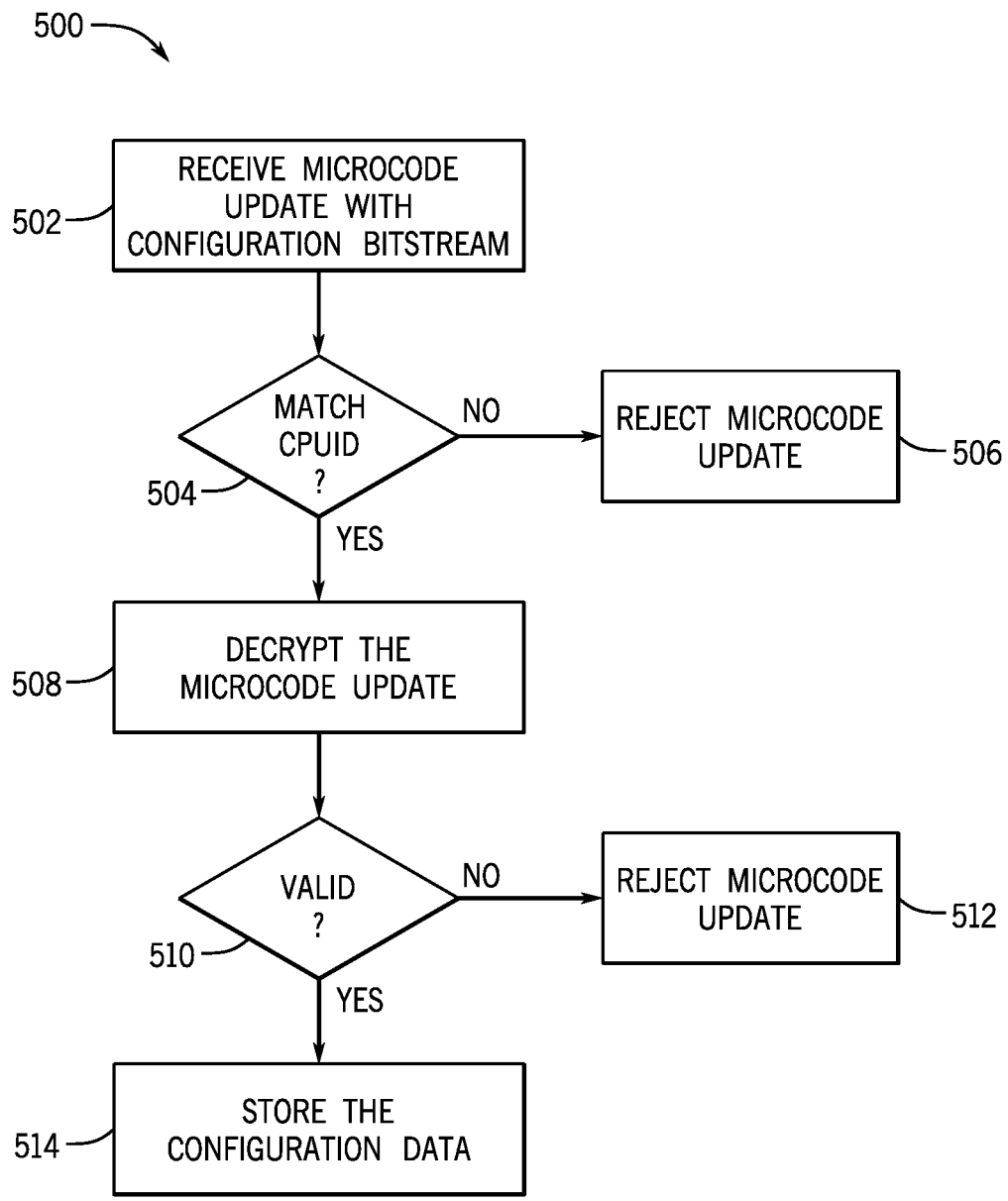
FIG. 12 is a flow diagram of a method for receiving, authenticating, and storing a configuration bitstream to configure the programmable fabric of FIGS. 9 and/or 10, in accordance with an embodiment.

Since loading external configuration bitstreams in an FPGA embedded in the processor may contain security and/or integrity risks, some level of authentication and/or verification may be applied to the configuration bitstream prior to loading. For instance, to load the configuration into the FPGA unit 440, the configuration data may be stored using data transferred in a configuration bitstream distributed as part of authenticated microcode patches. For instance, the processor may implement a process 500 illustrated in FIG. 12 to load in configuration data. As illustrated, the processor receives a microcode patch/update with the configuration bitstream included (block 502). A microcode update may include one or more patched microcode operations. The microcode operations may correspond to operations that are performed by the processor directly or after conversion from more complex (e.g., x86) instructions. The microcode update may be received as part of a BIOS flash. For microcode updates including configuration bitstreams, one or more patched microcode operations may be included with the microcode update.

The processor may determine whether a header in the microcode update matches a processor identification (CPUID) for the processor (block 504). If the header in the microcode update does not match the CPUID, the processor may discard/reject the microcode update (block 506). If the microcode update matches the header in the CPUID, the processor may decrypt the microcode update (block 508). The decryption may include one, two, or more levels of decryption. The processor may use the decrypted microcode update to determine whether the microcode update is valid for the processor (block 510). For instance, the validation may include determining whether the microcode update matches a revision for the processor firmware, a stepping level for the processor, and the like. Additionally or alternatively, the validation check may include security feature checks, such as checking a certificate within the microcode, a private/public key pair, and/or other security mechanisms suitable for checking microcode updates/patches for security and/or integrity. In some embodiments, the CPUID match checking in block 504 may be combined into the validation step in block 510 in addition to or alternative to the checking in block 504.

Any microcode patches that fail the validation/verification may be discarded/rejected by the processor (block 512). The processor may store configuration data from validated and verified microcode updates/patches (block 514). Any other operations updated in the microcode update, may also be updated similar to microcode updates that do not include configuration bitstreams. After application of the update/ storage of the configuration bitstream, the CPUID for the processor may be updated. The functionality in the configuration bitstream may be exposed as a combination of CPUID leaves and microcode version. A configuration state machine (CSS) in the processor/FPGA may be accessed as a chassis endpoint. The CSS uses/works off of a chassis clock and clears the configuration RAM (CRAM). The CSS also routes the configuration bits to respective logic array blocks of the FPGA computation grid 446. The CSS may also be used to periodically readback the CRAM and detect single event tolerant (SEUT) events. Based on these events or other events, the processor may utilize a power gate event to transition the FPGA computation grid 446 to an un-programmed state.

Figure 13:
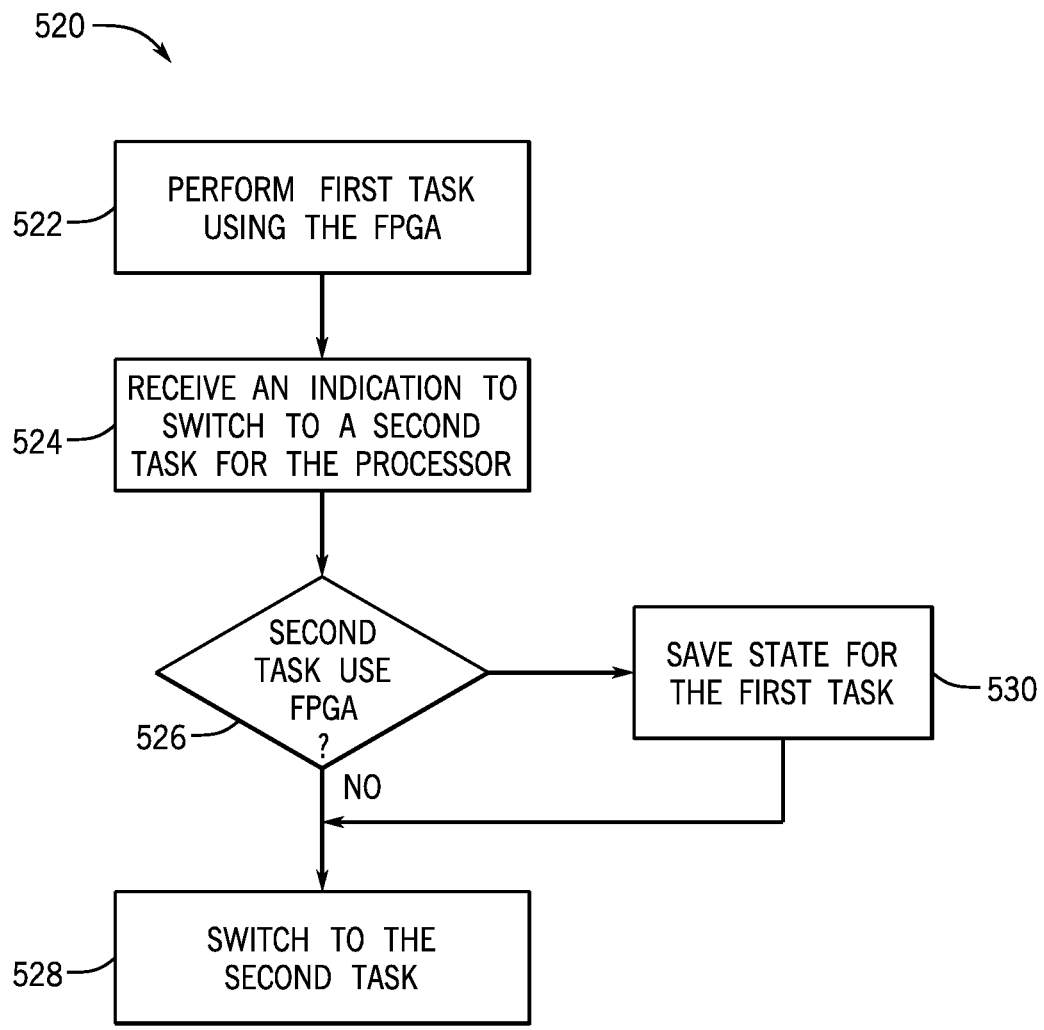
FIG. 13 is flow diagram of a method for performing task switching for a multitasking operating system, in accordance with an embodiment.

Since the processor may be used to implement a multi-tasking OS, the processor may concurrently execute multiple tasks and may switch between programs being worked on by a core. This switching includes saving a state of the program being used and loading a state of a task being switched to for the core. In one example, different tasks or programs may be executed using different core or FPGA clock frequencies. The bitstream may implement some functionality that lessens the impact of per-task state saving latency when context switches happen between various processes/virtual machines in a software stack. For state saving in general purpose registers, the processor may handle such state saving as a typical saving of the state. For saving a state associated with the FPGA unit 440, the latency may be considerably longer due to the memory dependency of state the state for the FPGA unit 440. To mitigate this latency, the processor may reduce the time demands by performing periodic saving of states for the FPGA unit 440. Additionally or alternatively, the processor may save states for the FPGA unit 440 selectively rather than for each switch between tasks. For instance, FIG. 13 is a flow diagram of a process 520 for selectively saving states when switching between tasks. As illustrated in the process 520, the processor performs part of a first task using the FPGA unit 440 (block 522).

The processor receives and/or generates an indication to switch to a second task for a core of the processor (block 524). The processor then determines whether the second task is to use the FPGA unit 440 in performance of the task (block 526). If the second task is not to use the FPGA unit 440, the processor switches to the second task without saving the first task (block 528). This switching may be performed without saving the state of the first task in the FPGA since the FPGA will remain unchanged by the second task. By performing switching without saving the state, the switching may be performed without the memory dependent latency in saving the state of the FPGA unit 440. If the second task and the first task both use the FPGA unit 440, the processor saves the state for the first task (block 530) before switching to the second task. Saving the state may include transmitting the state to the DCU 412. The processor then may utilize the FPGA unit 440 to perform at least part of the second task.

Clock Transition Circuitry

Figure 14:
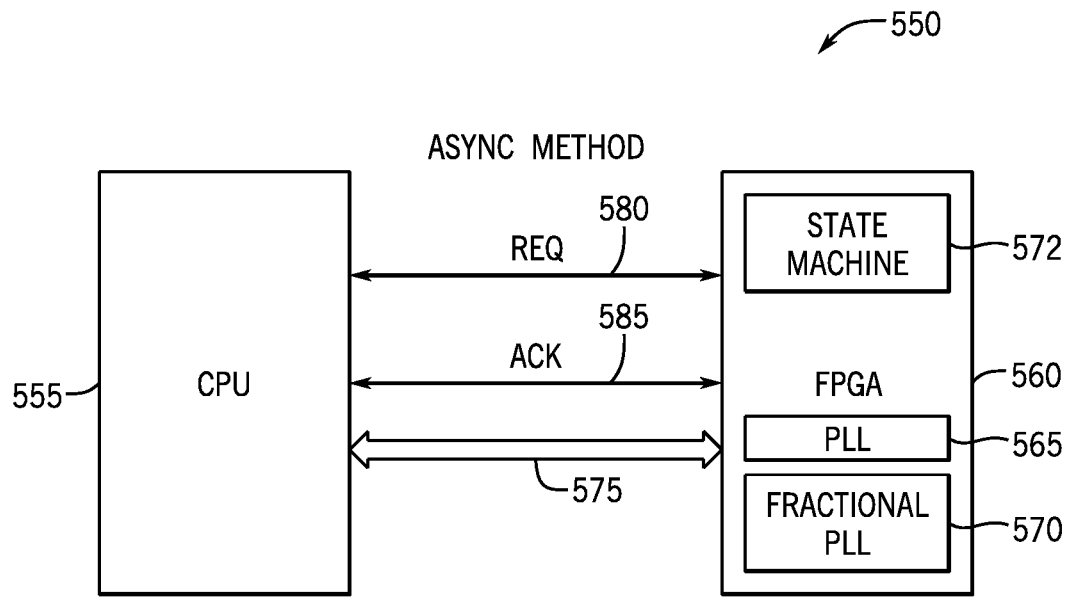
FIG. 14 is a block diagram of a system for asynchronous communication support between a CPU and an FPGA with varying frequency within a system using flexible ISA, in accordance with an embodiment.

FIG. 14 illustrates a block diagram of a processor 550 depicting communication between a CPU 555 and an FPGA 560, implemented as part of the flexible ISA described above. For example, the CPU 555 may correspond to the processor core 54 of FIG. 2B, the processor 130 of FIG. 4 including more than one processor core, the system 150 of FIG. 5, the multiprocessor system 170 of FIG. 6, and/or the SoC 250 of FIG. 7. Moreover, the FPGA 560 may include any programmable logic device (PLD), such as the FPGA 340 of FIG. 9. Furthermore, the processor 550 may correspond to the system 310 of FIG. 8 and may use the architectures 400 of FIG. 10 or architecture 460 of FIG. 11.

The CPU 555 may include one or more general purpose in-order cores, one or more general purpose out-of-order cores, and/or one or more special purpose cores. Moreover, the processor 550 may use different computer system architectures, which may include: 1) the CPU 555 on a separate chip from the FPGA 560; 2) the CPU 555 on a separate die in the same package as the FPGA 560; 3) the CPU 555 on the same die as the FPGA 560, and 4) a system on a chip that may include on the same die the CPU 555, the FPGA 560, and additional circuitry.

The FPGA 560 may include one or more FPGA computation grids (e.g., FPGA computation grid 446 described above) each including a programmable fabric. The programmable fabrics may be configured to perform flexible functions using a configuration stored in the FPGA 560 via a compiled design that is created as user logic and loaded into the FPGA 560. Moreover, the FPGA 560 may include a PLL 565 configurable to toggle at a range of clock frequencies up to a maximum clock frequency rate (e.g., 430 MHz). In different embodiments, the maximum clock frequency rate may correspond to a maximum clock frequency rate of the PLL 565, maximum clock frequency rate of the FPGA 560, maximum clock frequency rate of the processor 550, a system level maximum clock frequency, among other possibilities. In any case, the PLL 565 may toggle using a clock frequency below the maximum clock frequency rate.

The PLL 565 may provide a clock signal to circuitry of the FPGA 560 during operation. In some embodiments, the maximum PLL clock frequency (of the PLL 565) may be lower than the CPU clock frequency. For example, the PLL 565 may have a maximum PLL clock frequency in an order of Mega Hertz frequency range (e.g., 100 MHz, 200 MHz, 400 MHz, etc.) while the CPU 555 may have a CPU clock frequency in an order of Giga Hertz Frequency range (e.g., 1 GHz, 2 GHz, 4 GHz, etc.). That said, the PLL 565 may be configurable to toggle at other clock frequencies below the maximum clock frequency. For example, a designer may provide a microcode patch including a configuration bitstream that may set an operating clock frequency of the FPGA 560 (the PLL clock frequency) to a clock frequency below the maximum PLL clock frequency. In any case, the operating clock frequency of the FPGA 560 may be a fraction of the CPU clock frequency.

With that in mind, the CPU 555 and the FPGA 560 may communicate based on a clock synchronization process (e.g., hand shaking) using a clock transition circuitry such as the clock synchronization circuitries 444 described above with respect to FIGS. 10 and 11. For example, the processor 550 may use clock transition circuitry to perform a clock synchronization process for transitioning data (e.g., bitstreams) between the CPU 555 and the FPGA 560. In the depicted embodiment, the FPGA 560 may include a fractional PLL 570 to perform the clock synchronization process. In specific embodiments, the FPGA 560 may include a state machine 572 associated with the fractional PLL 570 to perform the clock synchronization process. For example, the fractional PLL 570 may communicate with the state machine 572 to receive an indication of the maximum PLL clock frequency and provide the resulting PLL clock frequency below the maximum PLL clock frequency. In alternative embodiments, the fractional PLL 570 may be implemented as a standalone circuitry positioned between the FPGA 560 and the CPU 555 within the flexible ISA, as will be appreciated.

To perform the clock synchronization process, the fractional PLL 570 may obtain (e.g., receive an indication of) the CPU clock frequency and the maximum PLL clock frequency of the FPGA 560. Based on the CPU clock frequency and the maximum PLL clock frequency, the fractional PLL 570 may determine (e.g., negotiate) a PLL clock frequency below the maximum clock frequency of the FPGA 560, where the CPU clock frequency is the PLL clock frequency times an integer value. In some embodiments, the multiple may be a value other than an integer (e.g., 1.5). The fractional PLL 570 may then configure the PLL 565 to run at the determined PLL clock frequency. Moreover, the fractional PLL 570 may determine and provide a clock ratio to the CPU 555 based on the integer value. Accordingly, the CPU 555 may use the clock ratio to communicate with the FPGA 560 using the PLL clock frequency. For example, the CPU 555 may transmit and receive each data bit using multiple CPU clock cycles, repeating or skipping transmission of a bit in at least some clock cycles of the CPU clock based on the clock ratio, when communicating with the FPGA 560 due to slower clock frequency rate of the FPGA 560.

Subsequent to the clock synchronization process, the CPU 555 and the FPGA 560 may communicate data via a pipeline 575. The pipeline 575 may correspond to various communications between the CPU 555 and the FPGA 560, such as the matrix multiply commands 408, the load/store tile command 410, the load tile data 414, and/or the store tile data 415 described above. Accordingly, the fractional PLL 570 may facilitate cohesive communication between the CPU 555 and the FPGA 560 running at different clock frequencies. That is, based on the clock synchronization process of the fractional PLL 570, a designer may use the microcode patches described above to communicate with both of the CPU 555 and the FPGA 560 with no regard to the clock frequency differences.

That said, in additional or alternative embodiments, the FPGA 560 may include multiple PLLs, including the PLL 565, each toggling at different clock frequency rates. For example, each of the multiple PLLs may clock different portions of the circuitry of the FPGA 560 during operation. In such embodiments, the processor 550 may include multiple fractional PLLs each being similar or different from the fractional PLL 570. Each respective fractional PLL may perform a clock transition process to facilitate communication between the CPU 555 and a respective portion of the FPGA 560 being clocked using a respective PLL at a respective PLL clock frequency. Moreover, in some embodiments, the processor 550 (or the flexible ISA) may include more than one FPGA, each FPGA including one or more PLLs. In such embodiments, similar clock transition circuitry (e.g., the fractional PLL 570) may perform the clock synchronizing process for each of the PLLs.

Figure 15:
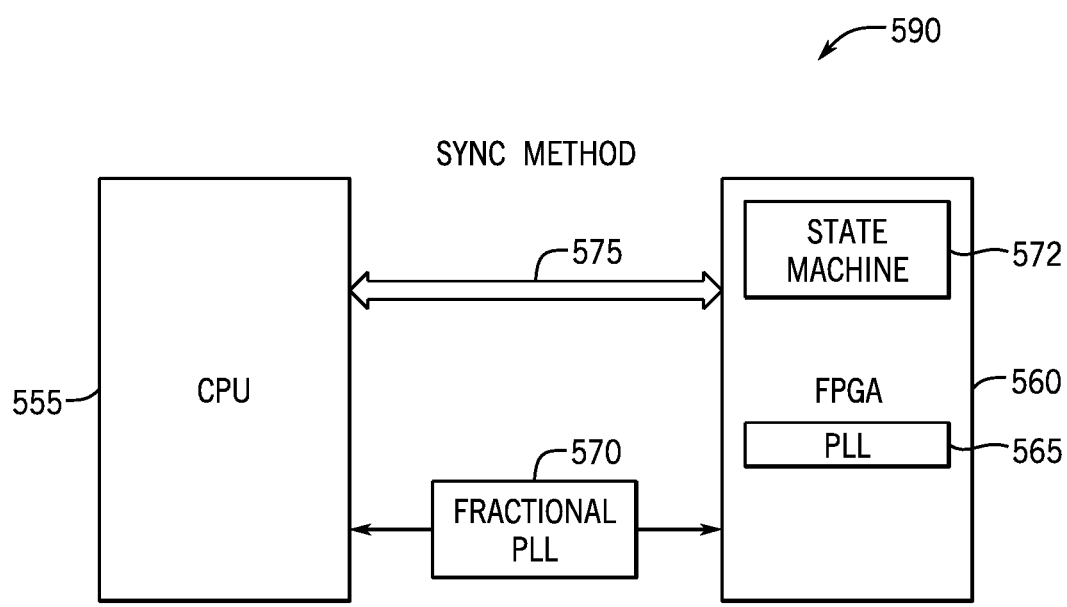
FIG. 15 is a block diagram of a system for synchronous communication support between a CPU and an FPGA with varying frequency within a system using flexible ISA, in accordance with an embodiment.

The processor 550 may depict asynchronous communication using a request command 580 and an acknowledge command 585 based on implementation of the fractional PLL 570 on the FPGA 560. However, utilizing the request command 580 and the acknowledge command 585 to transfer data may lengthen the time taken to exchange data. Instead, a synchronous method may be used to synchronize the data exchange between the CPU 555 and the FPGA 560. Referring now to FIG. 15, a processor 590 is depicted including the fractional PLL 570 positioned outside the FPGA 560 to facilitate synchronous communication between the CPU 555 and the FPGA 560. For example, the fractional PLL 570 may perform the clock synchronization process between the CPU 555 and the PLL 565 of the FPGA 560 described above, and the CPU 555 and the FPGA 560 may communicate data synchronously via the pipeline 575. In various embodiments, the fractional PLL 570 may be implemented using dedicated circuitry comprising programmable logic, hard logic, processing circuitry, and/or any other viable circuitry, to perform the clock synchronization process.

Figure 16:
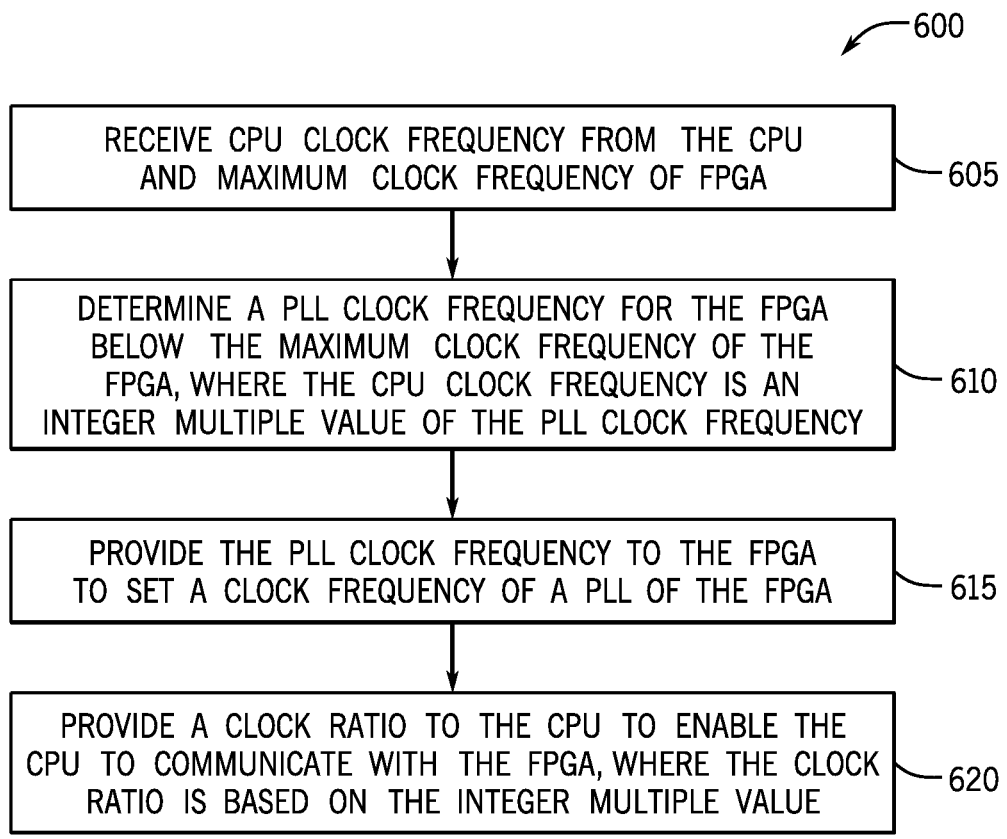
FIG. 16 is flow diagram of a method for communication support between a CPU and an FPGA with varying frequency for a system using flexible ISA, in accordance with an embodiment.

Referring now to FIG. 16, a process 600 for performing clock synchronization between a CPU and an FPGA of the processors 550 and/or 590, in accordance with the flexible ISA is described. The process 600 may be performed by a fractional PLL, such as the fractional PLL 570 of FIGS. 14 and 15. For example, the CPU may correspond to the CPU 555 of FIGS. 14 and 15, the processor core 54 of FIG. 2B, the processor 130 of FIG. 4 including more than one processor core, the system 150 of FIG. 5, the multiprocessor system 170 of FIG. 6, and/or the SoC 250 of FIG. 7. Moreover, the FPGA may correspond to the FPGA 560 of FIGS. 15 and 16 and/or the FPGA 340 of FIG. 9. While the blocks of the process 600 below are provided in a sequence, it should be understood that the blocks may be performed in different orders, and in some cases, at least some blocks may be skipped entirely.

At block 605, the fractional PLL receives CPU clock frequency from the CPU and maximum clock frequency of the FPGA. For example, the fractional PLL may receive indications of the operating clock frequency of the CPU and a maximum clock frequency of the FPGA and store the frequencies in the fractional PLL. In a first non-limiting illustrative example, the CPU clock may toggle at 2.0 GHz and the maximum clock frequency of the FPGA may correspond to a maximum PLL clock frequency of 432 MHz. Subsequently, at block 610, the fractional PLL determines and/or negotiates a PLL clock frequency for the FPGA below the maximum clock frequency of the FPGA where the CPU clock frequency is the PLL clock frequency times some value (e.g., an integer) (block 610). In accordance with the first example above, the fractional PLL may determine a PLL clock frequency of 200 MHz for the FPGA, where the CPU clock frequency toggles at 10X the PLL clock frequency (i.e., the integer value=10).

At block 615, the fractional PLL provides the determined PLL clock frequency to the FPGA to set a clock frequency of the PLL of the FPGA. For example, the fractional PLL may send a value of the determined PLL clock frequency, provide encoded values indicative of the determined PLL clock frequency, and/or transmit sample clock signals with the determined PLL clock frequency, among other indicative forms of frequencies, to provide the determined PLL clock frequency to the FPGA. Moreover, at block 620, the fractional PLL provides a signal indicative of a clock ratio to the CPU to enable the CPU to communicate with the FPGA. The clock ratio is based on the integer multiple value that is the ratio between the CPU clock frequency and the PLL clock frequency, as previously discussed. In accordance with the first example above, the fractional PLL may provide a clock ratio of $1/10^{th}$ to the CPU to enable the CPU to communicate with the FPGA. Accordingly, the CPU may repeat a bit to be transferred for 10 cycles or attempt to transmit bits every 10 cycles while suppressing transmission for the nine cycles between those that align to the PLL frequency of the FPGA.

Based on using the processors 550 and 590 and the process 600 described above, a designer may provide instructions (e.g., microcode patches including configuration bitstreams) to the flexible ISA at different times for execution. The flexible ISA may use one or more fractional PLLs to execute the configuration bitstreams associated with the configurable logic of one or more FPGAs using appropriate clock frequencies, based on a clock frequency of the respective core, processor, or CPU. Accordingly, the respective core, processor, or CPU may execute commands on one or more FPGAs running at different clock frequencies.

Data Processing System

Figure 17:
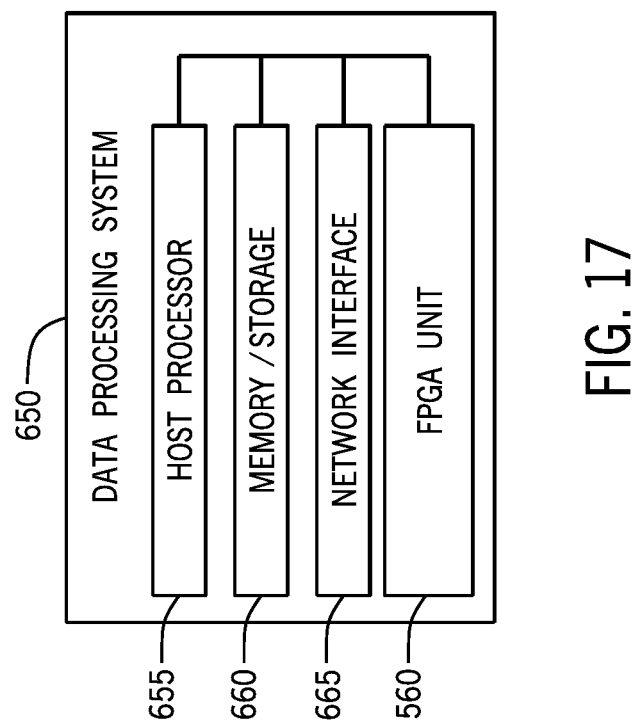
FIG. 17 is a block diagram of a data processing system including a processor with an integrated programmable fabric unit, in accordance with an embodiment.

Bearing the foregoing in mind, the CPU 555 and the FPGA 560 may be integrated into a data processing system or may be a component included in a data processing system. For example, the CPU 555 may be a component of a data processing system 650, shown in FIG. 17. The data processing system 650 may include a host processor 655 (e.g., the CPU 555), memory and/or storage circuitry 660, and a network interface 665. The data processing system 650 may include more or fewer components (e.g., electronic display, user interface structures, application specific integrated circuits (ASICs)). The host processor 655 may include any of the foregoing processors that may manage a data processing request for the data processing system 650 (e.g., to perform encryption, decryption, machine learning, video processing, voice recognition, image recognition, data compression, database search ranking, bioinformatics, network security pattern identification, spatial navigation, cryptocurrency operations, or the like).

The memory and/or storage circuitry 660 may include random access memory (RAM), read-only memory (ROM), one or more hard drives, flash memory, or the like. The memory and/or storage circuitry 660 may hold data to be processed by the data processing system 650. In some cases, the memory and/or storage circuitry 660 may also store configuration programs (bitstreams) for programming the FPGA 560. The network interface 665 may allow the data processing system 650 to communicate with other electronic devices. The data processing system 650 may include several different packages or may be contained within a single package on a single package substrate. For example, components of the data processing system 650 may be located on several different packages at one location (e.g., a data center) or multiple locations. For instance, components of the data processing system 650 may be located in separate geographic locations or areas, such as cities, states, or countries.

In one example, the data processing system 650 may be part of a data center that processes a variety of different requests. For instance, the data processing system 650 may receive a data processing request via the network interface 665 to perform encryption, decryption, machine learning, video processing, voice recognition, image recognition, data compression, database search ranking, bioinformatics, network security pattern identification, spatial navigation, digital signal processing, or some other specialized task.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible, or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

Example Embodiments

EXAMPLE EMBODIMENT 1. A processor comprising:
a CPU comprising one or more processor cores operating based on a CPU clock frequency;
a PLD communicatively coupled to the CPU and operating based on a first PLL clock frequency provided by a first PLL, wherein the first PLL is configurable to provide a first PLL clock frequency up to a maximum PLL clock frequency of the first PLL; and
a first fractional PLL communicatively coupled to the CPU and the PLD wherein the first fractional PLL performs clock synchronization operations comprising:
receive an indication of the CPU clock frequency;
receive an indication of the maximum PLL clock frequency;
determine the first PLL clock frequency below the maximum PLL clock frequency, wherein the CPU clock frequency is an integer multiple value of the first PLL clock frequency;
provide an indication of the first PLL clock frequency to the first PLL to set the first PLL clock frequency; and
provide a clock ratio between the CPU clock frequency and the first PLL clock frequency to the CPU to enable the CPU to communicate with the PLD, wherein the clock ratio is based on the integer multiple value.

EXAMPLE EMBODIMENT 2. The processor of claim 1, wherein the CPU and the PLD communicate data using the first PLL clock frequency.

EXAMPLE EMBODIMENT 3. The processor of claim 2, wherein the CPU transmits and receives data using a number of clock cycles of the CPU clock frequency based on the clock ratio.

EXAMPLE EMBODIMENT 4. The processor of claim 1, wherein the CPU clock frequency is higher than the maximum PLL clock frequency.

EXAMPLE EMBODIMENT 5. The processor of claim 1, wherein the PLD comprises one or more computation grids.

EXAMPLE EMBODIMENT 6. The processor of claim 1, wherein the PLD comprises a state machine to:
provide an indication of the maximum PLL clock frequency to the first fractional PLL; and
receive an indication of the first PLL clock frequency from the first fractional PLL.

EXAMPLE EMBODIMENT 7. The processor of claim 1, wherein the PLL may comprise the first fractional PLL implemented thereto.

EXAMPLE EMBODIMENT 8. The processor of claim 1, wherein the first fractional PLL is positioned between the CPU and the PLL.

EXAMPLE EMBODIMENT 9. The processor of claim 1, wherein the first fractional PLL is implemented using programmable circuitry, hardened circuitry, processing circuitry, any combination thereof, or any other viable circuitry, to perform the clock synchronization operations.

EXAMPLE EMBODIMENT 10. The processor of claim 1, comprising:
a plurality of PLLs comprising the first PLL, each of the plurality of PLLs providing a respective PLL clock frequency to a portion of the PLD; and a plurality of fractional PLLs including the first fractional PLL, each of the plurality of fractional PLLs is associated with a respective PLL of the plurality of PLLs to perform clock synchronization operations.

EXAMPLE EMBODIMENT 11. A method comprising:
receiving, by a fractional PLL of a processor, an indication of a CPU clock frequency of a CPU of the processor;
receiving, by the fractional PLL, an indication of maximum clock frequency of a PLD of the processor;
determining, by the fractional PLL, a PLL clock frequency for the PLD below the maximum clock frequency of the PLD, wherein the CPU clock frequency is an integer multiple value of the PLL clock frequency;
providing, by the fractional PLL, an indication of the PLL clock frequency to the PLD to set a clock frequency of the PLL of the PLD; and
providing, by the fractional PLL, a clock ratio to the CPU to enable the CPU to communicate with the PLD, wherein the clock ratio is based on the integer multiple value.

EXAMPLE EMBODIMENT 12. The method of claim 11, wherein the CPU clock frequency is higher than the maximum clock frequency of the PLD.

EXAMPLE EMBODIMENT 13. The method of claim 11, wherein the maximum clock frequency of the PLD corresponds to a maximum clock frequency of the PLL of the PLD.

EXAMPLE EMBODIMENT 14. The method of claim 11, wherein the clock ratio indicates a ratio between the CPU clock frequency and the PLL clock frequency and the CPU communicates with the PLD using the PLL clock frequency based on receiving the clock ratio.

EXAMPLE EMBODIMENT 15. The method of claim 11, wherein the PLD performs operations using the PLL clock frequency.

EXAMPLE EMBODIMENT 16. The method of claim 11, wherein the fractional PLL is implemented on the PLD, wherein the fractional PLL facilitates asynchronous communication between the CPU and the PLD.

EXAMPLE EMBODIMENT 17. The method of claim 11, wherein the fractional PLL is implemented using dedicated circuitry on the processor, wherein the fractional PLL facilitates synchronous communication between the CPU and the PLD.

EXAMPLE EMBODIMENT 18. An integrated circuit device comprising:
one or more processing cores, a PLD, and a fractional PLL communicatively coupled using an Instruction Set Architecture (ISA), wherein the fractional PLL sets a PLL clock frequency of the PLD based on a core clock frequency of the one or more processing cores.

EXAMPLE EMBODIMENT 19. The integrated circuit device of claim 18, wherein the core clock frequency is a multiple integer value of the PLL clock frequency.

EXAMPLE EMBODIMENT 20. The integrated circuit device of claim 19, wherein the fractional PLL provides a clock ratio indicative of the multiple integer value to enable communication between the one or more processing cores and the PLD within the ISA of the integrated circuit.

EXAMPLE EMBODIMENT 21. The integrated circuit device of claim 20, wherein the one or more processing cores communicate data with the PLD using the set PLL clock frequency based on receiving the clock ratio.

EXAMPLE EMBODIMENT 22. The integrated circuit device of claim 18, wherein the fractional PLL receives an indication of the core clock frequency and an indication of a maximum clock frequency of the PLD and sets the PLL clock frequency to a fraction of the core clock frequency that is below the maximum clock frequency of the PLD.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A processor comprising:
a CPU comprising one or more processor cores operating based on a CPU clock frequency;
a PLD communicatively coupled to the CPU operating based on a first PLL clock frequency provided by a first PLL, wherein the first PLL is configurable to provide a first PLL clock frequency up to a maximum PLL clock frequency of the first PLL; and
a first fractional PLL communicatively coupled to the CPU and the PLD wherein the first fractional PLL performs clock synchronization operations comprising:
receive an indication of the CPU clock frequency;
receive an indication of the maximum PLL clock frequency;
determine the first PLL clock frequency below the maximum PLL clock frequency, wherein the CPU clock frequency is an integer multiple value of the first PLL clock frequency;
provide an indication of the first PLL clock frequency to the first PLL to set the first PLL clock frequency; and
provide a clock ratio between the CPU clock frequency and the first PLL clock frequency to the CPU to enable the CPU to communicate with the PLD, wherein the clock ratio is based on the integer multiple value.

2. The processor of claim 1, wherein the CPU and the PLD communicate data using the first PLL clock frequency.

3. The processor of claim 2, wherein the CPU transmits and receives data using a number of clock cycles of the CPU clock frequency based on the clock ratio.

4. The processor of claim 1, wherein the CPU clock frequency is higher than the maximum PLL clock frequency.

5. The processor of claim 1, wherein the PLD comprises one or more computation grids.

6. The processor of claim 1, wherein the PLD comprises a state machine to:
provide an indication of the maximum PLL clock frequency to the first fractional PLL; and
receive an indication of the first PLL clock frequency from the first fractional PLL.

7. The processor of claim 1, wherein the PLL may comprise the first fractional PLL implemented thereto.

8. The processor of claim 1, wherein the first fractional PLL is positioned between the CPU and the PLL.

9. The processor of claim 1, wherein the first fractional PLL is implemented using programmable circuitry, hardened circuitry, processing circuitry, any combination thereof, or any other viable circuitry, to perform the clock synchronization operations.

10. The processor of claim 1, comprising:
a plurality of PLLs comprising the first PLL, each of the plurality of PLLs providing a respective PLL clock frequency to a portion of the PLD; and
a plurality of fractional PLLs including the first fractional PLL, each of the plurality of fractional PLLs is associated with a respective PLL of the plurality of PLLs to perform clock synchronization operations.

11. A method comprising:
receiving, by a fractional PLL of a processor, an indication of a CPU clock frequency of a CPU of the processor;
receiving, by the fractional PLL, an indication of maximum clock frequency of a PLD of the processor;
determining, by the fractional PLL, a PLL clock frequency for the PLD below the maximum clock frequency of the PLD, wherein the CPU clock frequency is an integer multiple value of the PLL clock frequency;
providing, by the fractional PLL, an indication of the PLL clock frequency to the PLD to set a clock frequency of the PLL of the PLD; and
providing, by the fractional PLL, a clock ratio to the CPU to enable the CPU to communicate with the PLD, wherein the clock ratio is based on the integer multiple value.

12. The method of claim 11, wherein the CPU clock frequency is higher than the maximum clock frequency of the PLD.

13. The method of claim 11, wherein the maximum clock frequency of the PLD corresponds to a maximum clock frequency of the PLL of the PLD.

14. The method of claim 11, wherein the clock ratio indicates a ratio between the CPU clock frequency and the PLL clock frequency and the CPU communicates with the PLD using the PLL clock frequency based on receiving the clock ratio.

15. The method of claim 11, wherein the PLD performs operations using the PLL clock frequency.

16. The method of claim 11, wherein the fractional PLL is implemented on the PLD, wherein the fractional PLL facilitates asynchronous communication between the CPU and the PLD.

17. The method of claim 11, wherein the fractional PLL is implemented using dedicated circuitry on the processor, wherein the fractional PLL facilitates synchronous communication between the CPU and the PLD.

18. An integrated circuit device comprising:
one or more processing cores, a PLD, and a fractional PLL communicatively coupled using an Instruction Set Architecture (ISA), wherein the fractional PLL sets a PLL clock frequency of the PLD based on a core clock frequency of the one or more processing cores and provides a clock ratio between the core clock frequency and the PLL clock frequency to at least one processing core of the one or more processing cores to enable the at least one processing core to communicate with the PLD.

19. The integrated circuit device of claim 18, wherein the core clock frequency is a multiple integer value of the PLL clock frequency.

20. The integrated circuit device of claim 19, wherein the fractional PLL provides the clock ratio indicative of the multiple integer value to enable communication between the one or more processing cores and the PLD within the ISA of the integrated circuit.

21. The integrated circuit device of claim 18, wherein the one or more processing cores communicate data with the PLD using the set PLL clock frequency based on receiving the clock ratio.

22. The integrated circuit device of claim 18, wherein the fractional PLL receives an indication of the core clock frequency and an indication of a maximum clock frequency of the PLD and sets the PLL clock frequency to a fraction of the core clock frequency that is below the maximum clock frequency of the PLD.

* * * * *